United States Patent [19]

Watanabe et al.

[11] Patent Number: 5,523,598

[45] Date of Patent: Jun. 4, 1996

[54] SEMICONDUCTOR INTEGRATED CIRCUIT DEVICE

[75] Inventors: Atsuo Watanabe, Hitachioota; Kazushige Sato, Ohme, both of Japan

[73] Assignee: Hitachi, Ltd., Tokyo, Japan

[21] Appl. No.: 261,133

[22] Filed: Jun. 14, 1994

[30] Foreign Application Priority Data

Jun. 15, 1993 [JP] Japan .................................. 5-143162
Sep. 20, 1993 [JP] Japan .................................. 5-232155

[51] Int. Cl.⁶ ........................ H01L 27/108; H01L 29/76; H01L 29/94; H01L 31/119
[52] U.S. Cl. ............................................ 257/301; 257/390
[58] Field of Search ..................................... 257/301, 390

[56] References Cited

U.S. PATENT DOCUMENTS 4,262,297  4/1981  Partridge ..................................... 357/24
4,358,432  5/1983  Kuo et al. .................................... 29/571

*Primary Examiner*—Jerome Jackson
*Assistant Examiner*—Stephen D. Meyer
*Attorney, Agent, or Firm*—Antonelli, Terry, Stout & Kraus

[57] ABSTRACT

The gate electrodes of the driver MISFETs, transfer MISFETs and load MISFETS of the static random access memory (SRAM) are formed of the first-level conductive layer deposited over the main surface of the semiconductor substrate. The gate electrodes, power source voltage line, reference voltage line, local interconnection lines, and complementary data lines, all making up the conductive layers of the SRAM memory cell, are formed of different conductive layers, i.e. conductive layers of different levels. The local interconnection lines and the reference voltage line or power source voltage line are arranged, with respect to a plan view of the main surface of the substrate, to cross each other and a capacitance is formed in the intersecting regions.

22 Claims, 37 Drawing Sheets

5,523,598

SEMICONDUCTOR INTEGRATED CIRCUIT DEVICE

BACKGROUND OF THE INVENTION

The present invention relates to a semiconductor integrated circuit device and more particularly to a technology suitably applied to a semiconductor integrated circuit device having a Static Random Access Memory (SRAM). An example description about SRAM is given in IEDM (International Electron Devices Meeting) Technical Digest, pp. 39–42, 1992.

An SRAM as a semiconductor memory device includes memory cells, each consisting of a flip-flop circuit and two transfer MISFETs (Metal Insulator Semiconductor Field-Effect Transistors) at intersections between complementary data lines and word lines.

The flip-flop circuit of the memory cell is formed as an information storage section that stores one bit of information. The flip-flop circuit is formed, for example, of a pair of CMOS (Complementary Metal Oxide Semiconductor FET) inverters. Each of the CMOS inverters consists of an n-channel driver MISFET and a p-channel load MISFET. The transfer MISFETs formed are of n-channel type.

An equivalent circuit of the SRAM memory cell made up of these six MISFETs is shown in FIG. 36.

As shown in the figure, one of the CMOS inverters $INV_1$ includes a driver MISFET $Qd_1$ and a load MISFET $Qp_1$ while the other CMOS inverter $INV_2$ includes a driver MISFET $Qd_2$ and a load MISFET $Qp_2$. The input and output terminals of these paired CMOS inverters $INV_1$, $INV_2$ are cross-coupled through a pair of interconnects (hereinafter referred to as local interconnection lines) $L_1$, $L_2$ to form a flip-flop circuit. One end of the flip-flop circuit is connected to a power supply voltage $V_{CC}$ and the other end to a reference voltage $V_{SS}$.

The operation of the above circuit is described below. When the output node A of one CMOS inverter $INV_1$ is at high potential "H," the driver MISFET $Qd_2$ conducts causing the output node B of the other CMOS inverter $INV_2$ to go low "L." Hence, the driver MISFET $Qd_1$ turns off, holding the output node A at high potential "H." In other words, a latch circuit consisting of the paired CMOS inverters $INV_1$, $INV_2$ cross-coupled with each other retains the states of these output nodes, i.e. holding information while being impressed with the supply voltage.

One of the source region and the drain region of the transfer MISFET $Qt_1$ is connected to the input/output terminal of one of the CMOS inverters $INV_1$ of the flip-flop circuit, while the other of the source and drain region is connected to one of the complementary data lines (first data line $D_1$). One of the source and drain region of the transfer MISFET $Qt_2$ is connected to the input/output terminal of the second CMOS inverter $INV_2$ of the flip-flop circuit, while the other of the source and drain region is connected to the other complementary data line (second data line $D_2$).

The two transfer MISFETs $Qt_1$, $Qt_2$ have their gate electrodes connected with a word line WL, which controls the conduction and non-conduction of the transfer MISFETs $Qt_1$, $Qt_2$. That is, when the word line WL is at high potential "H," the transfer MISFETs $Qt_1$, $Qt_2$ are turned on, connecting the latch circuit with the complementary data lines, so that the potential states (either "H" for high or "L" for low) of the node A and node B appear on the complementary data line and is read out as memory cell information. On the contrary, it is possible to forcibly apply the potentials of the complementary data lines to the node A and node B.

FIG. 37 illustrates one example of a pattern layout of the SRAM memory cell shown in the above equivalent circuit.

The six MISFETs making up the memory cell, i.e. transfer MISFETs $Qt_1$, $Qt_2$, driver MISFETs $Qd_1$, $Qd_2$ and load MISFETs $Qp_1$, $Qp_2$, each have a source-drain region formed in the semiconductor substrate and a gate electrode formed on top of the semiconductor substrate. The transfer MISFETs $Qt_1$, $Qt_2$ have a common gate electrode 50 formed integrally with the word line WL. The gate electrode 50 (word line WL) is normally formed of a polycrystalline silicon film, or a polycide film which is a laminated film of a polycrystalline silicon film and a high melting point metal silicide film.

The driver MISFET $Qd_1$ and the load MISFET $Qp_1$, both making up the first CMOS inverter $INV_1$ of the flip-flop circuit, have a common gate electrode 51. The driver MISFET $Qd_2$ and the load MISFET $QP_2$, making up the second CMOS inverter $INV_2$, have a common gate electrode 52. These gate electrodes 51, 52 and the gate electrode 50 (word line WL) for the transfer MISFETs $Qt_1$, $Qt_2$ are formed of the same polycrystalline silicon film or polycide film, which is fabricated by the same process.

Deposited over the gate electrodes 50, 51, 52 through an interlayer insulating film not shown are a power source voltage line 53, a reference voltage line 54 and a pair of local interconnection lines $L_1$, $L_2$ cross-coupling the input/output terminals of the paired CMOS invertors $INV_1$, $INV_2$. The power source voltage line 53, the reference voltage line 54 and the paired local interconnection lines $L_1$, $L_2$ are formed of the same metal film (aluminum alloy, tungsten, etc.) which is fabricated by the same process.

The power source voltage line 53 is connected to the source regions of the load MISFETs $Qp_1$, $Qp_2$ via connecting holes 55, 55; and the reference voltage line 54 is connected to the source regions of the driver MISFETs $Qd_1$, $Qd_2$ through connecting holes 56, 56. One end of the local interconnection line $L_2$ is connected to the drain region of the load MISFET $QP_2$ through a connecting hole 57; and the other end is connected through a connecting hole 58 to the drain region of the driver MISFET $Qd_2$ (one of the source and drain region of the transfer MISFET $Qt_2$) and to the gate electrode 51 of the driver MISFET $Qd_1$ (load MISFET $Qp_1$). One end of the local interconnection line $L_1$ is connected through a connecting hole 59 to the drain region of the load MISFET $Qp_1$ and the gate electrode 52 of the driver MISFET $Qd_2$ (load MISFET $Qp_2$); and the other end is connected through a connecting hole 60 to the drain region of the driver MISFET $Qd_1$ (one of the source and drain region of the transfer MISFET $Qt_1$).

Deposited over the power source voltage line 53, the reference voltage line 54 and the local interconnection lines $L_1$, $L_2$ are a pair of complementary data lines (first data line $D_1$ and second data line $D_2$) which are formed of a second metal film (aluminum alloy, tungsten, etc.). The first data line $D_1$ is connected to the other of the source and drain region of the transfer MISFET $Qt_1$ through a connecting hole 61 and a pad layer 62. The second data line $D_2$ is connected to the other of the source and drain region of the transfer MISFET $Qt_2$ through a connecting hole 63 and the pad layer 62. The pad layer 62 is formed of the same first layer metal film that is used to form the power source voltage line 53, the reference voltage line 54 and the local interconnection lines $L_1$, $L_2$.

As described above, in the SRAM, the gate electrodes of the six MISFETs—which make up the memory cell—are formed of the first layer polycrystalline silicon film (or polycide film) 50, 51, 52 formed on the surface of the semiconductor substrate. The power source voltage line 53, the reference voltage line 54 and the paired local interconnection lines $L_1$, $L_2$ are formed of the first metal film deposited over the polycrystalline silicon film (or polycide film). The paired complementary data lines $D_1$, $D_2$ are formed of the second layer metal film deposited over the first layer metal film.

SUMMARY OF THE INVENTION

The present inventors have found that the SRAM described above is limited insofar as having a design capability of a higher-density integration of memory cells.

That is, the memory cells of the SRAM have the power source voltage line, the reference voltage line and the local interconnection lines all formed of the same conductive layer (the first layer metal film). Hence, when it is attempted to increase the circuit density of the memory cells, it is only possible to reduce the layout intervals ($t_1$, $t_2$, $t_3$ shown in FIG. 37) to the limit of the microfabrication technique, i.e. minimum fabrication dimension. The reduction of memory cell dimension therefore depends on these intervals ($t_1$, $t_2$, $t_3$).

With the above SRAM, it is also difficult to meet the requirements of higher circuit integration of memory cells and those of operation reliability at the same time.

SRAM memory cells in general store information in the output nodes of the paired CMOS inverters and it is, therefore, essential, from the standpoint of stably holding information and securing operation reliability, to increase the capacitance Cs applied to the output node so as to increase the accumulated electric charge. Particularly with the above-mentioned SRAM, what matters is the capacitance formed between the local interconnection line connected to the output node and the conductive layers overlying or underlying the local interconnection line.

The above SRAM, however, has only the gate electrode of the driver MISFET (load MISFET) as the conductive layer that can form capacitance between it and the local interconnection line, so that it is necessary to increase the areas of the gate electrodes 51, 52 (shaded pattern in FIG. 38) that intersect the local interconnection lines. Because an increase in the area of the gate electrode means an area increase of memory cell, it is therefore not possible to reduce the memory cell size and increase the capacitance at the same time.

It is an object of the present invention to provide a technology which makes it possible to realize higher circuit integration of SRAM memory cells.

Another object of this invention is to provide a technology that can meet both requirements for higher circuit integration of SRAM memory cells and for securing operation reliability.

These and other objects and novel features of this invention will become apparent from the following description in this specification and from the accompanying drawings.

Representative aspects of this invention disclosed in this specification are briefly described below.

(1) In the SRAM of this invention, the first conductive film formed on the main surface of the semiconductor substrate is used to form the gate electrodes of the driver MISFET, load MISFET and transfer MISFET; the second conductive film deposited over the first conductive film is used to form the power source voltage line connected to the source region of the load MISFET; the third conductive film deposited over the first conductive film is used to form a pair of local interconnection lines that interconnect the input/output terminals of paired CMOS inverters; the fourth conductive film deposited over the first conductive film is used to form the reference voltage line connected to the source region of the driver MISFET; and the first, second and third conductive layers are formed of conductive layers of different levels. The first, second and third conductive layers are arranged to intersect one another.

(2) In the SRAM of this invention, the first conductive film formed on the main surface of the semiconductor substrate is used to form the gate electrodes of the driver MISFET, load MISFET and transfer MISFET; the second conductive film deposited over the first conductive film is used to form the power source voltage line connected to the source region of the load MISFET; the third conductive film deposited over the second conductive film is used to form the reference voltage line connected to the source region of the driver MISFET; the fourth conductive film deposited over the third conductive film is used to form a pair of local interconnection lines that interconnect the input/output terminals of paired CMOS inverters; and the reference voltage line and the pair of local interconnection lines are arranged to intersect each other.

(3) In the SRAM of this invention, the first conductive film formed on the main surface of the semiconductor substrate is used to form the gate electrodes of the driver MISFET, load MISFET and transfer MISFET; the second conductive film deposited over the first conductive film is used to form the power source voltage line connected to the source region of the driver MISFET; the third conductive film deposited over the second conductive film is used to form the power source voltage line connected to the source region of the load MISFET; the fourth conductive film deposited over the third conductive film is used to form a pair of local interconnection lines that interconnect the input/output terminals of paired CMOS inverters; and the power source voltage line and the pair of local interconnection lines are arranged to intersect each other.

(4) In the SRAM of this invention, the first conductive film formed on the main surface of the semiconductor substrate is used to form the gate electrodes of the driver MISFET, load MISFET and transfer MISFET; the second conductive film deposited over the first conductive film is used to form the reference voltage line connected to the source region of the driver MISFET; the third conductive film deposited over the second conductive film is used to form a pair of local interconnection lines that interconnect the input/output terminals of paired CMOS inverters; the fourth conductive film deposited over the third conductive film is used to form the power source voltage line connected to the source region of the load MISFET; and the reference voltage line and the paired local interconnection lines, and the power source voltage line and the paired local interconnection lines are arranged so that the lines in each combination cross each other.

(5) In the SRAM of this invention, the first conductive film formed on the main surface of the semiconductor substrate is used to form the gate electrodes of the driver MISFET, load MISFET and transfer MISFET;

the second conductive film deposited over the first conductive film is used to form the power source voltage line connected to the source region of the load MISFET; the third conductive film deposited over the second conductive film is used to form a pair of local interconnection lines that interconnect the input/output terminals of paired CMOS inverters; the fourth conductive film deposited over the third conductive film is used to form the reference voltage line connected to the source region of the driver MISFET; and the power source voltage line and the paired local interconnection lines, and the reference voltage line and the paired local interconnection lines are arranged so that the lines in each combination cross each other.

(6) In the SRAM of (1) to (5), the field insulation film on the diagonal line of the isolation region for the driver MISFET and the load MISFET are set back, and the gate capacitance is formed between the gate electrode made of the first conductive film and the semiconductor substrate.

In the above means, with the power source voltage line, the reference voltage line and the local interconnection lines formed of different conductive layers, i.e. conductive layers of different levels, the dimension of the memory cell is restricted mainly by the gate electrode, the device forming region and the isolation distance between the device forming regions and not by the dimensions of the power source voltage line, reference voltage line and local interconnection lines. Therefore, the memory cell area can be reduced significantly.

By arranging the local interconnection lines so that they cross the power source voltage line or the reference voltage line or both, a capacitance is formed in the intersecting regions. With this invention, because the dimensions of the power source voltage line, reference voltage line and local interconnection lines are not the major factors that determine the area of the memory cell, it is possible to increase the area of the intersecting regions even when the memory cell area is reduced. That is, the accumulated electric charge can be increased by increasing the capacitance, so that information can be held stably even if the memory cell size is reduced, securing the operation reliability.

In the above-mentioned means, the field insulation film on the diagonal line of the isolation region for the driver MISFET and load MISFET is set back, making it possible to form the gate capacitance without enlarging the memory cell area. This in turn allows the accumulated electric charge to be increased without degrading the latch-up resistance even when the memory cell size is reduced, thus realizing stable retention of information and securing operation reliability.

DESCRIPTION OF THE PREFERRED EMBODIMENTS

Figure 1:
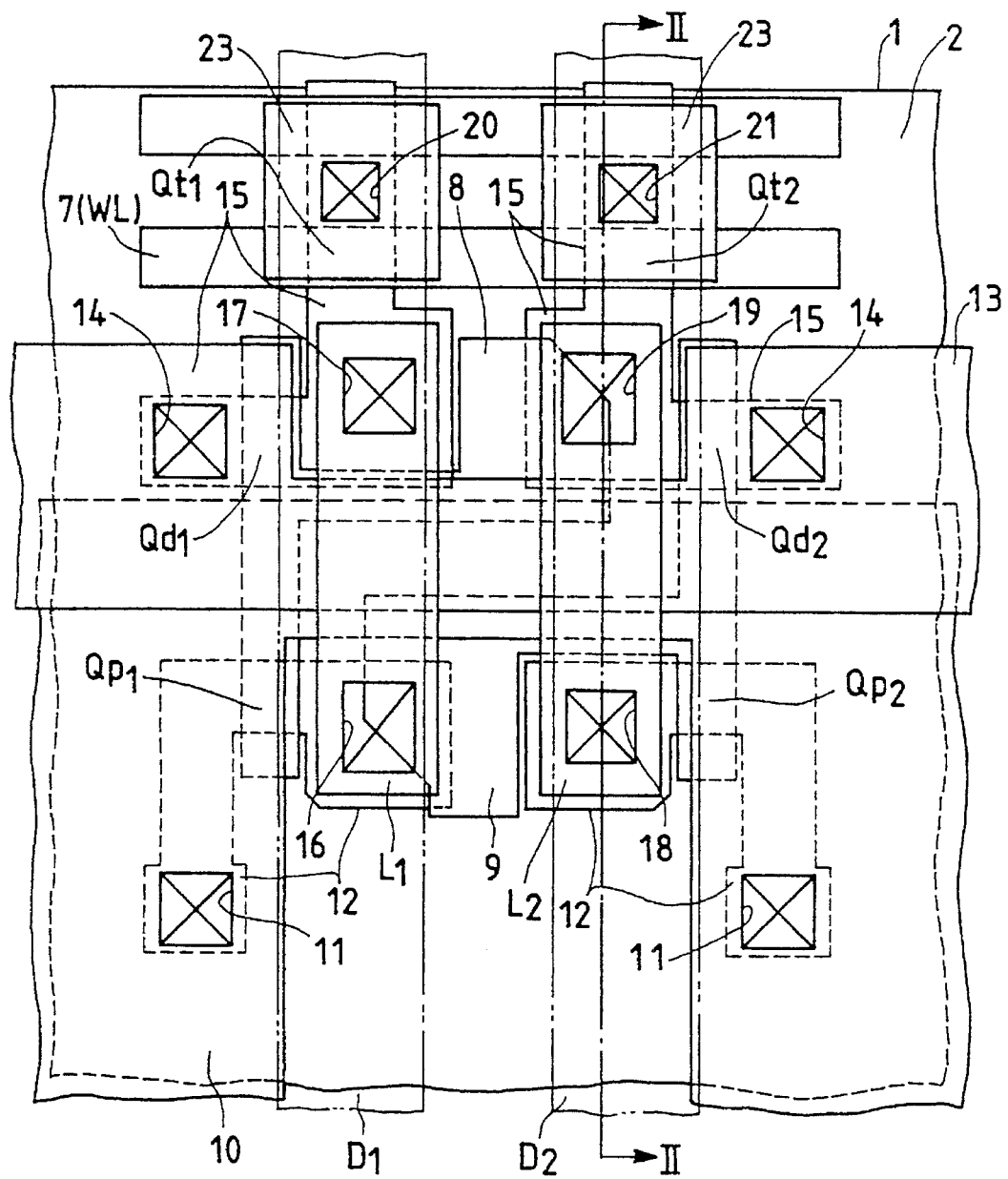
FIG. 1 is a plan view showing the layout of conductive layers making up an SRAM memory cell as one embodiment of this invention.

The present invention will be described in detail in conjunction with example embodiments. Throughout the drawings used for the description of this invention, parts with identical functions are assigned like reference numerals.

Embodiment 1

Figure 16:
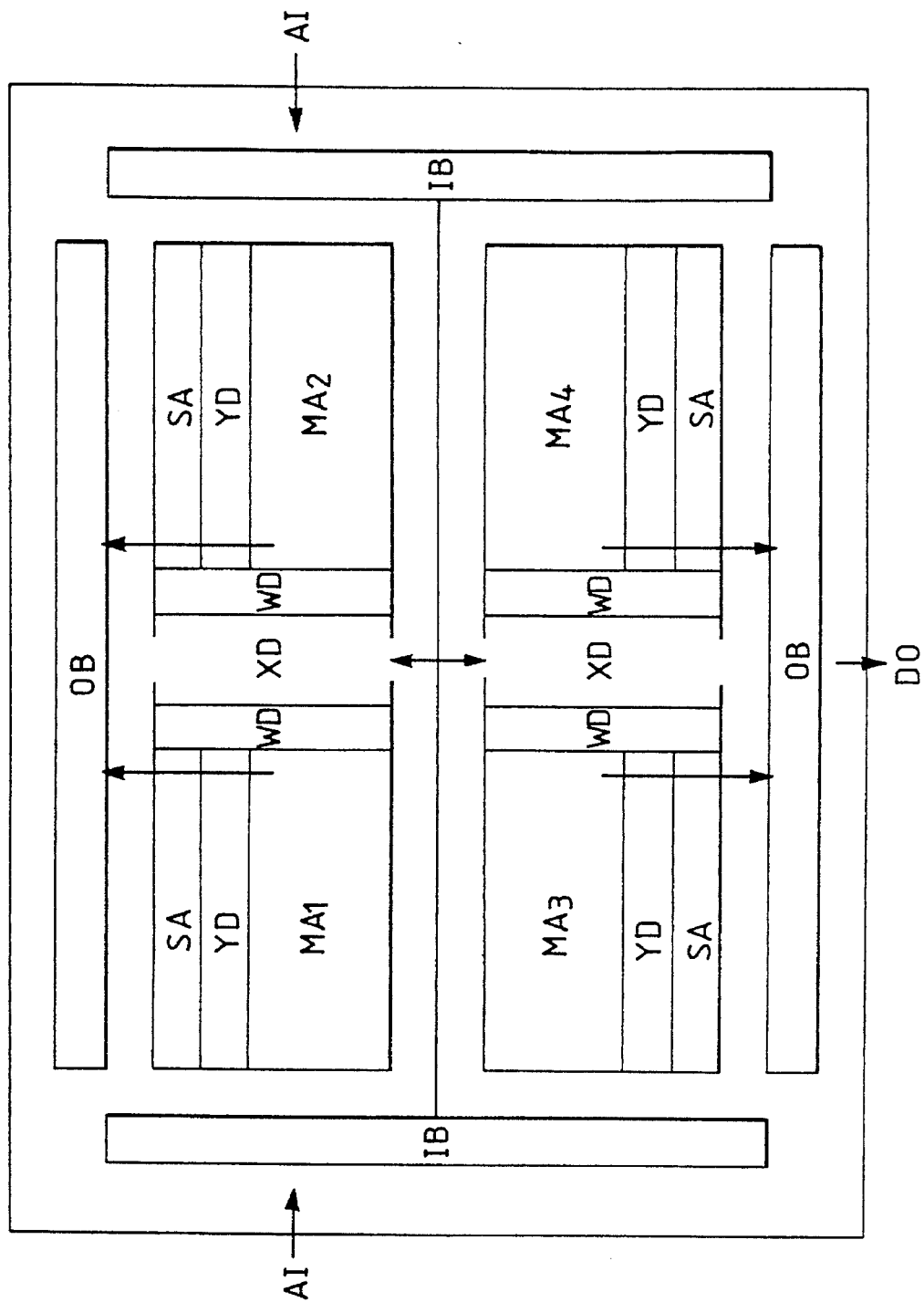
FIG. 16 is a schematic diagram showing the overall chip layout of the first embodiment SRAM.

FIG. 16 shows the rough overall configuration (chip layout) of SRAM as one embodiment of this invention.

On the main surface of a rectangular semiconductor chip (substrate) 1 is formed an SRAM having a memory capacity of, for example, four megabits [M bits] or more. The memory cell area of the SRAM is made up of four memory cell arrays $MA_1$–$MA_4$. In each of these memory cell arrays, a large number of memory cells each of which consists of six MISFETs described later are arranged in matrix form. The address input AI into the memory cell arrays is performed via peripheral circuits such as input buffer IB, X-system decoder XD and word driver WD. The data output DO from the memory cell arrays is performed through peripheral circuits including Y-decoder YD, sense amplifier SA and output buffer OB. These peripheral circuits comprise a CMOS circuit or a circuit (a bipolar CMOS circuit) consisting of a combination of a MISFET and a bipolar transistor, and are arranged around the memory cell array.

The technology which forms memory cells with CMOS transistors and the peripheral circuit with bipolar-CMOS transistors is described, for example, in the IEEE Journal of Solid-State Circuits, vol. 27, No. 4, pp. 632–639, 1992. The contents of this journal is inserted here as a reference.

Figure 2:
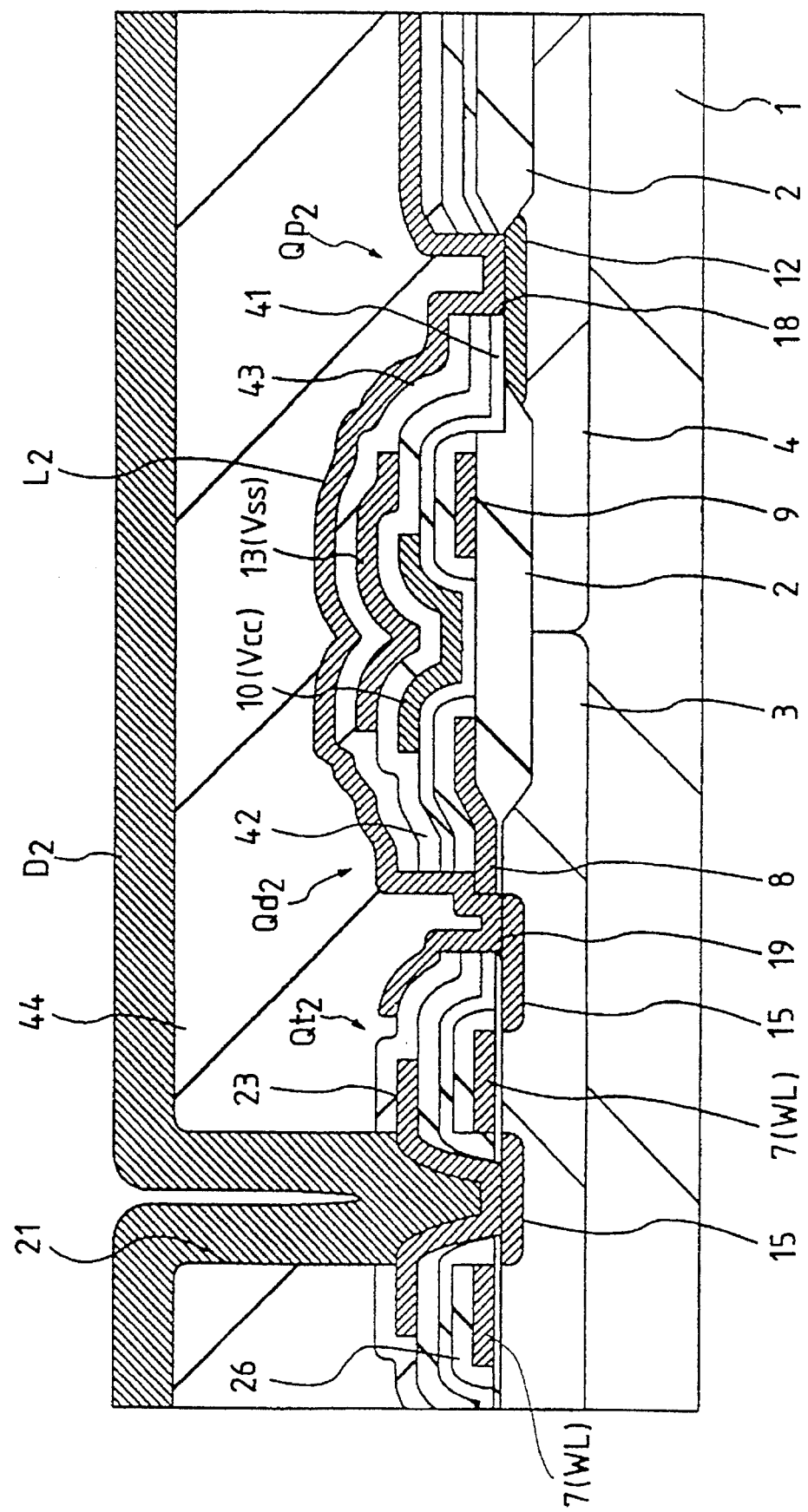
FIG. 2 is a cross section of the semiconductor chip (substrate) taken along the line II—II of FIG. 1.
Figure 3:
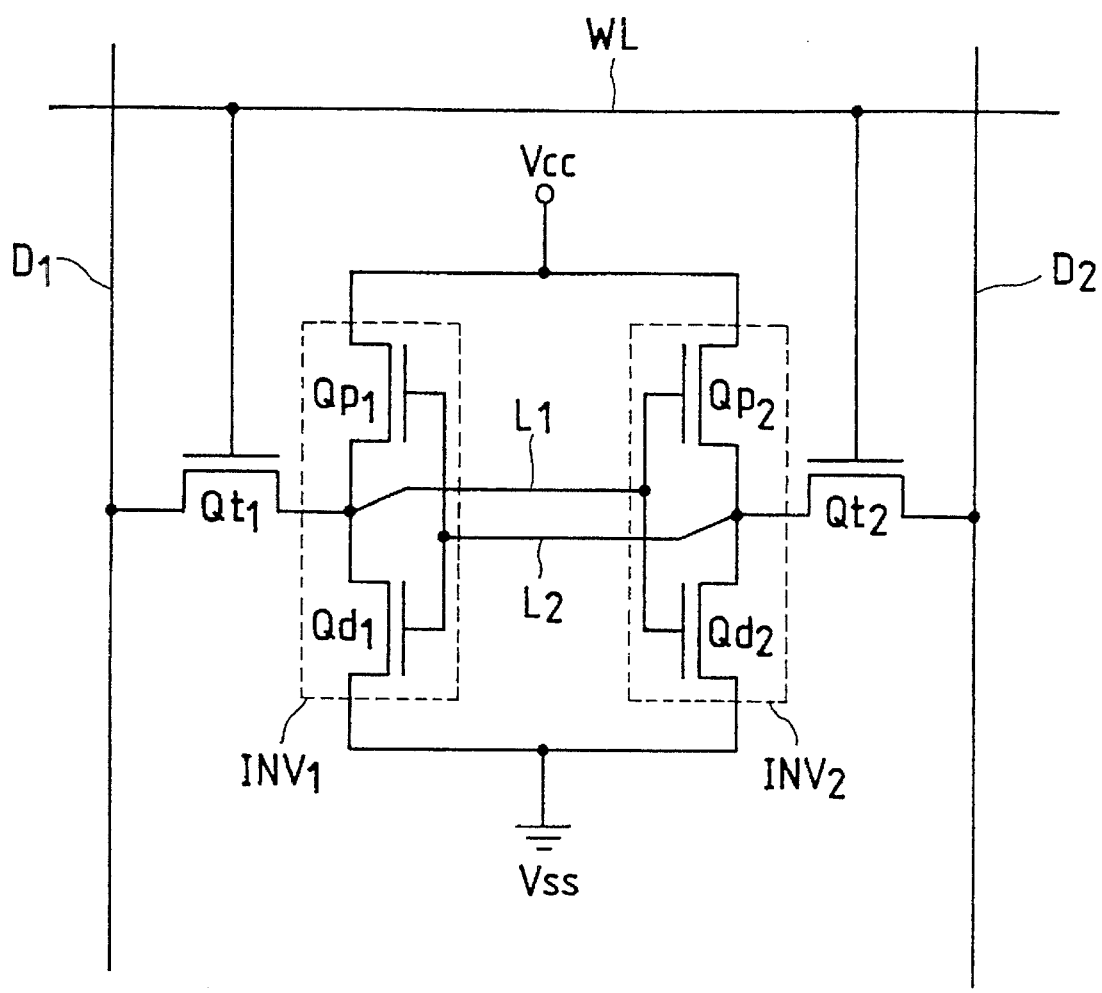
FIG. 3 is an equivalent circuit of the SRAM memory cell of the first embodiment of this invention.

Next, the structure of the SRAM memory cell of this embodiment is explained in concrete terms. FIG. 1 is a plan view showing the layout of conductive layers forming the memory cell MC; FIG. 2 is a cross section of the semiconductor chips(substrate) taken along the II—II line of FIG. 1; FIG. 3 is an equivalent circuit of the memory cell MC; and FIGS. 4 through 8 are plan views, each showing the layout of conductive layers of FIG. 1 on each level.

As shown in FIG. 1 and 3, the SRAM memory cell MC consists of six MISFETs, that is, transfer MISFETs $Qt_1$, $Qt_2$, driver MISFETs $Qd_1$, $Qd_2$, and load MISFETs $Qp_1$, $Qp_2$. The driver MISFET $Qd_1$ and load MISFET $Qp_1$ constitute a CMOS inverter $INV_1$, and the driver MISFET $Qd_2$ and load MISFET $Qp_2$ constitute a CMOS inverter $INV_2$. This pair of CMOS inverters $INV_1$, $INV_2$ form a flip-flop circuit. One end of the flip-flop circuit is connected with the power source voltage $V_{cc}$ and the other end with the reference voltage $V_{ss}$. The power source voltage $V_{cc}$ may, for example, be 5 V and the reference voltage $V_{ss}$ 0 V (at the ground potential).

Figure 4:
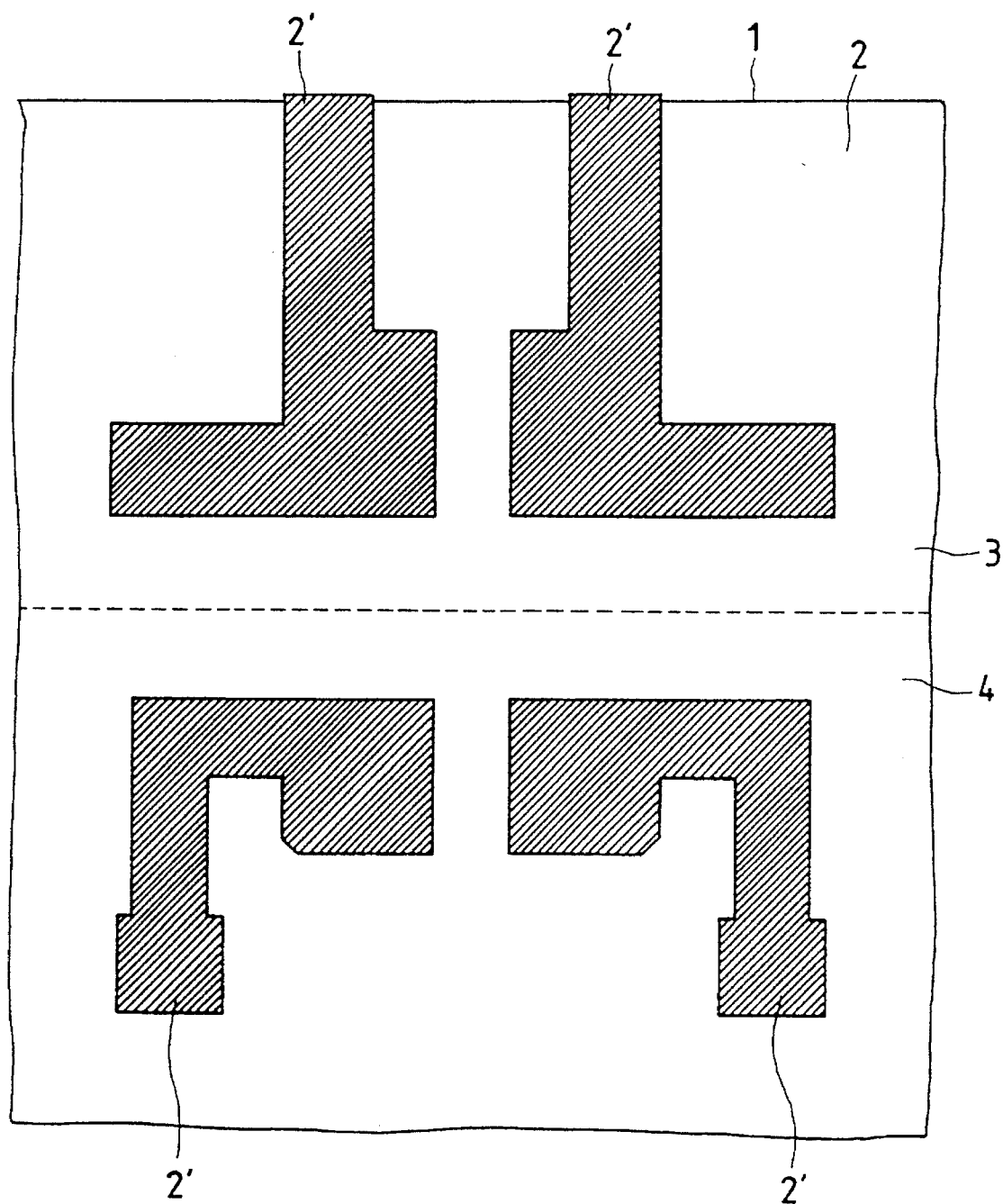
FIG. 4 is a plan view showing the layout of conductive layers of FIG. 1 deposited on one layer of the semiconductor chip.

As shown in FIG. 1, 2 and 4, the six MISFETs are formed in an active region 2' (a shaded area in FIG. 4) which is enclosed by the field insulating film 2 of the semiconductor substrate 1 made of $p^-$ type monocrystal silicon. The driver MISFETs $Qd_1$, $Qd_2$ and the transfer MISFETs $Qt_1$, $Qt_2$ are of n-channel type and formed in the active region of the p-type well 3. The load MISFETs $Qp_1$, $Qp_2$ are of p-channel type and formed in the active region of n-type well 4.

Figure 5:
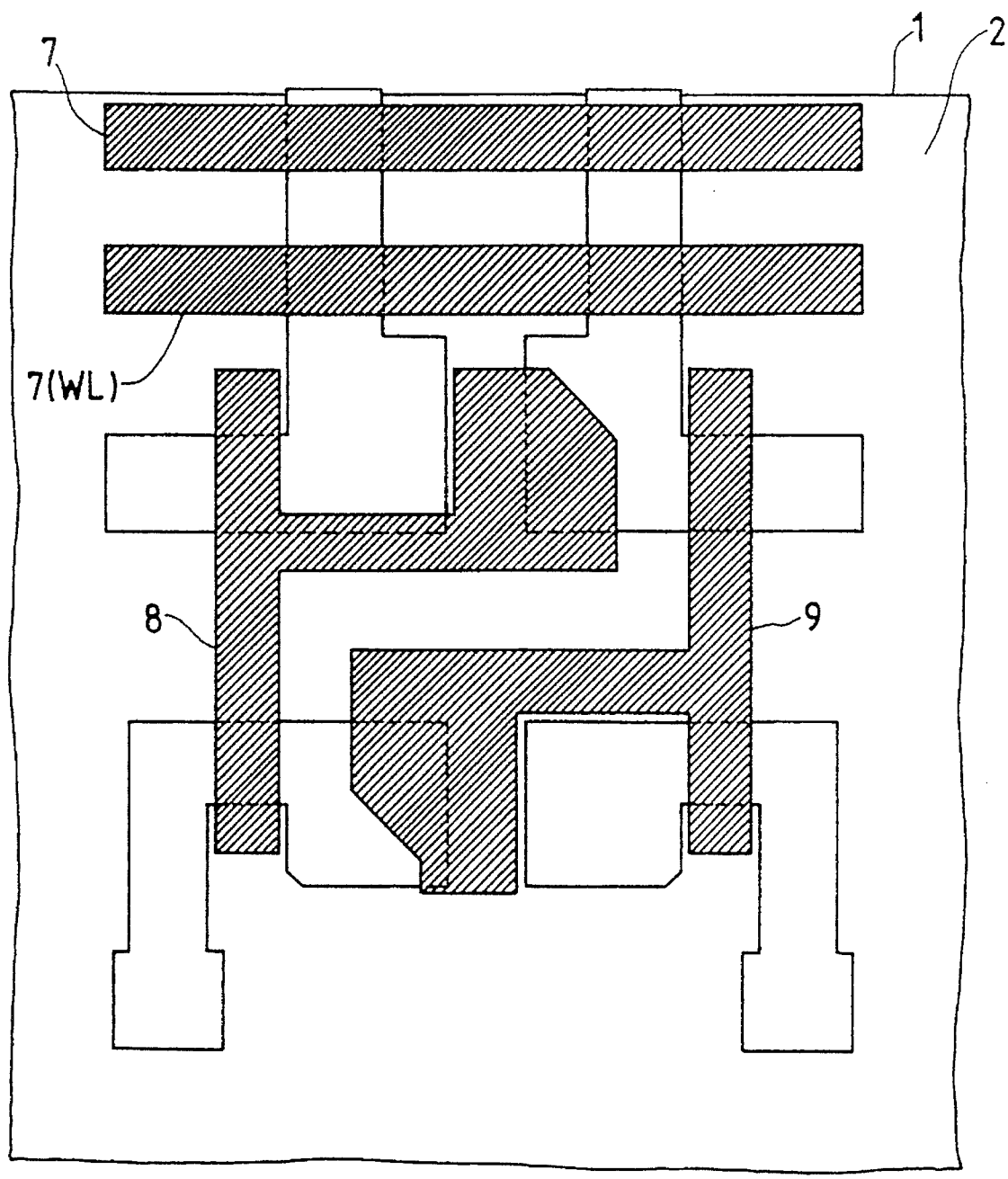
FIG. 5 is a plan view showing the layout of conductive layers of FIG. 1 deposited on another layer of the semiconductor chip.

As shown in FIG. 1, 2 and 5, the transfer MISFETs $Qt_1$, $Qt_2$ have a common gate electrode 7 formed integrally with the word line WL. This gate electrode 7 (word line WL) is formed of the first-layer polycrystalline silicon film (or polycide film). The driver MISFET $Qd_1$ and the load MISFET $Qp_1$ forming the first CMOS inverter $INV_1$ of the flip-flop circuit have a common gate electrode 8, while the driver MISFET $Qd_2$ and load MISFET $QP_2$ forming the second CMOS inverter $INV_2$ have a common gate electrode 9. These gate electrodes 8, 9 are formed of the same first-layer polycrystalline silicon film (or polycide film) that is used for the gate electrode 7 (word line WL) of the transfer MISFETs $Qt_1$, $Qt_2$. The polycrystalline silicon film that forms the gate electrodes 7, 8, 9 are doped with n-type impurities (phosphorus P for example).

Figure 6:
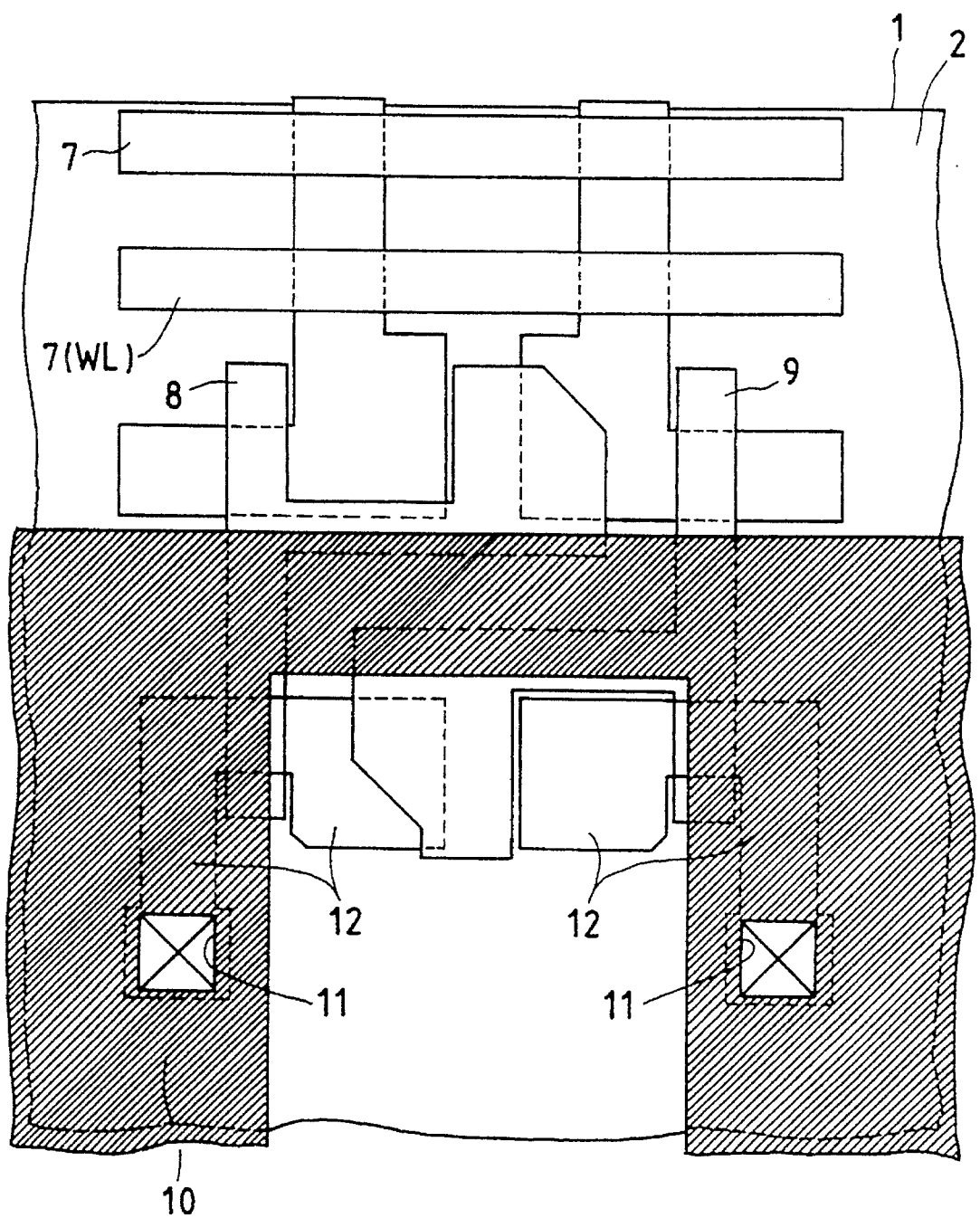
FIG. 6 is a plan view showing the layout of conductive layers of FIG. 1 deposited on another layer of the semiconductor chip.

As shown in FIG. 1, 2 and 6, over the gate electrodes 7, 8, 9 of the six MISFETs that make up the memory cell MC is deposited a power source voltage line 10 through the silicon oxide insulating film 26, 41. The power source voltage line 10 is connected to the source region (p-type semiconductor region 12) of each of the load MISFETs $Qp_1$, $QP_2$ via the connecting holes 11, 11. The power source voltage line 10 is formed of the second-layer polycrystalline silicon film (or polycide film). Because the power source voltage line 10 is connected to the p-type semiconductor regions 12, 12 of the load MISFETs $Qp_1$, $Qp_2$, the polycrystalline silicon film is doped with p-type impurities (boron B for example).

Figure 7:
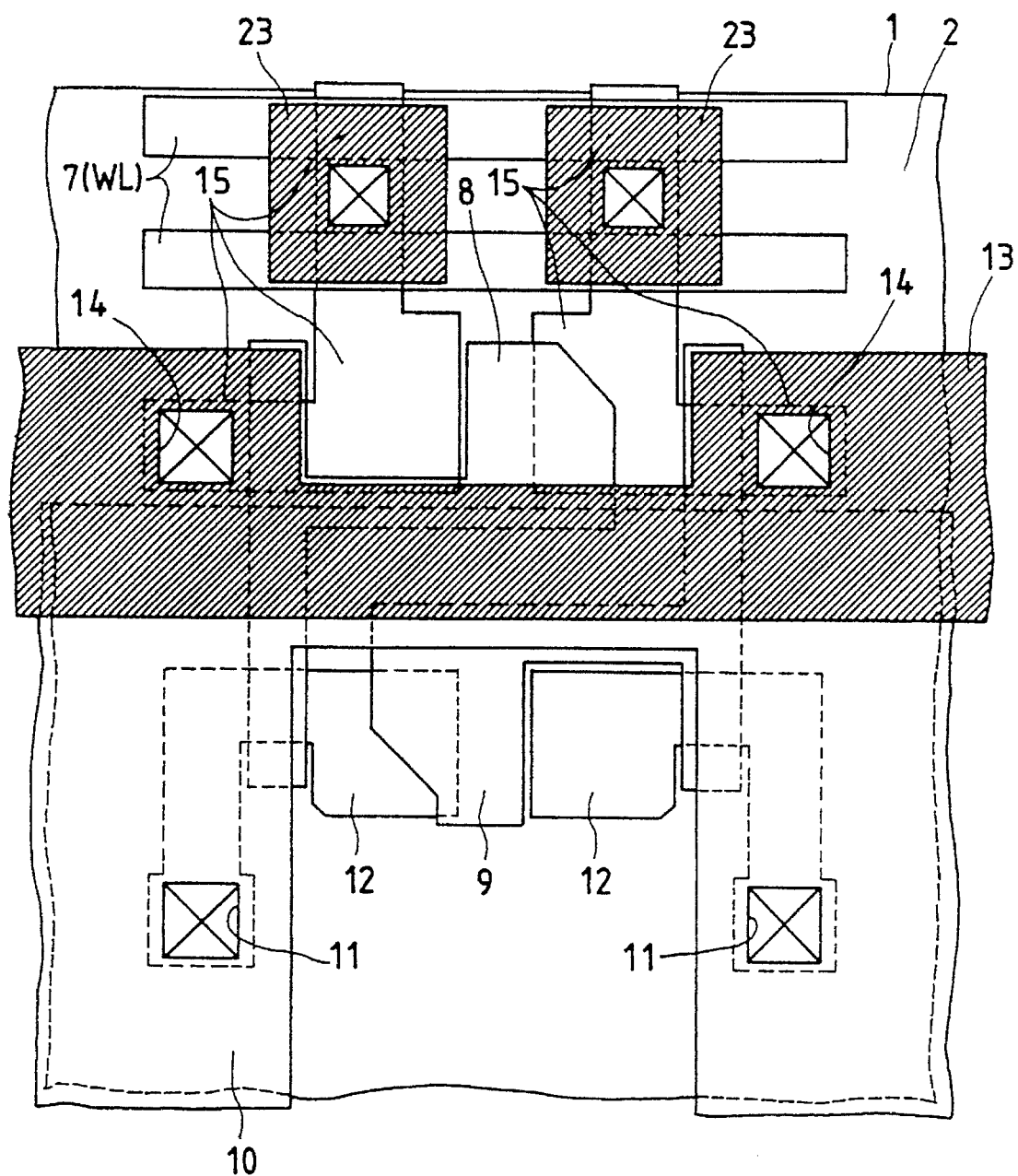
FIG. 7 is a plan view showing the layout of conductive layers of FIG. 1 deposited on another layer of the semiconductor chip.

As shown in FIG. 1, 2 and 7, the reference voltage line 13 is formed over the power source voltage line 10 with a silicon oxide insulating film 42 interposed between them. The reference voltage line 13 is connected to each of the source regions (n-type semiconductor region 15) of the driver MISFETs $Qd_1$, $Qd_2$ through the connecting holes 14, 14. The reference voltage line 13 is formed of a third-layer polycide film (or a laminated film of a polycrystalline silicon film and a high melting point metal film). Because the reference voltage line 13 is connected to the n-type semiconductor region 15, 15 of the driver MISFETs $Qd_1$, $Qd_2$, the polycrystalline silicon film is doped with n-type impurities (for example, phosphorus P).

Figure 8:
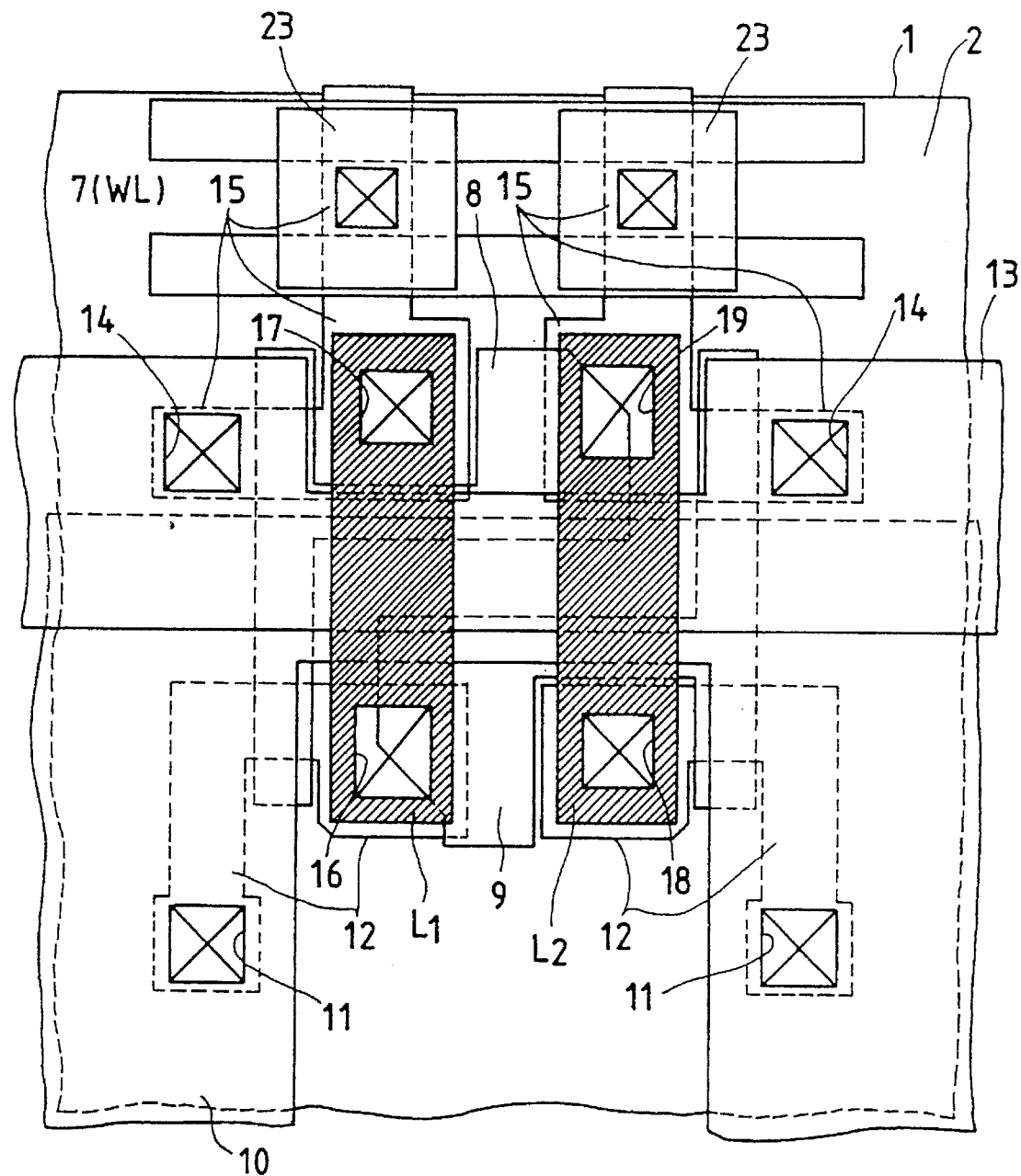
FIG. 8 is a plan view showing the layout of conductive layers of FIG. 1 deposited on another layer of semiconductor chip.

As shown in FIG. 1, 2 and 8, the local interconnection lines $L_1$, $L_2$ are formed over the reference voltage line 13 through the silicon oxide insulation film 43. These local interconnection lines $L_1$, $L_2$ and the underlying reference voltage line 13 are arranged to intersect each other on the memory cell MC.

One end of the local interconnection line $L_1$ is connected through the connection hole 16 to the drain region (p-type semiconductor region 12) of the load MISFET $Qp_1$ and the gate electrode 9 of the driver MISFET $Qd_2$ (load MISFET $Qp_2$). The other end of the local interconnection line $L_1$ is connected through the connection hole 17 to the drain region (n-type semiconductor region 15) of the driver MISFET $Qd_1$. One end of the local interconnection line $L_2$ is connected through the connection hole 18 to the drain region (p-type semiconductor region 12) of the load MISFET $Qp_2$, while the other end is connected through the connection hole 19 to the drain region (n-type semiconductor region 15) of the driver MISFET $Qd_2$ and the gate electrode 8 of the driver MISFET $Qd_1$ (load MISFET $Qp_1$). The local interconnection lines $L_1$, $L_2$ are formed of the first-layer metal film (aluminum alloy or high melting point metal such as tungsten). The local interconnection lines $L_1$, $L_2$ formed of metal film can have ohmic connection with the n-type semiconductor region 15 and with the p-type semiconductor region 12.

As can be seen from FIG. 1 and 2, a pair of complementary data lines (first data line $D_1$ and second data line $D_2$) are deposited over the local interconnection lines $L_1$, $L_2$ through an inter-layer insulation film 44, which is a laminated film of a spin-on-glass film and a silicon oxide film. The first data line $D_1$ is connected through the connection hole 20 to the pad layer 23, which is formed on one of the source region and the drain region of the transfer MISFET $Qt_1$ (n-type semiconductor region 15). The second data line $D_2$ is connected through the connection hole 21 to the pad layer 23, which is deposited on one of the source region and drain region of the transfer MISFET $Qt_2$. The pad layers 23, 23 are formed of the same third-layer polycide film (or a laminated film of polycrystalline silicon film and high melting point metal film) that is used for the reference voltage line 13. The complementary data line (first data line $D_1$ and second data line $D_2$) are formed of the second-layer metal film (such as aluminum alloy and tungsten).

Figure 9:
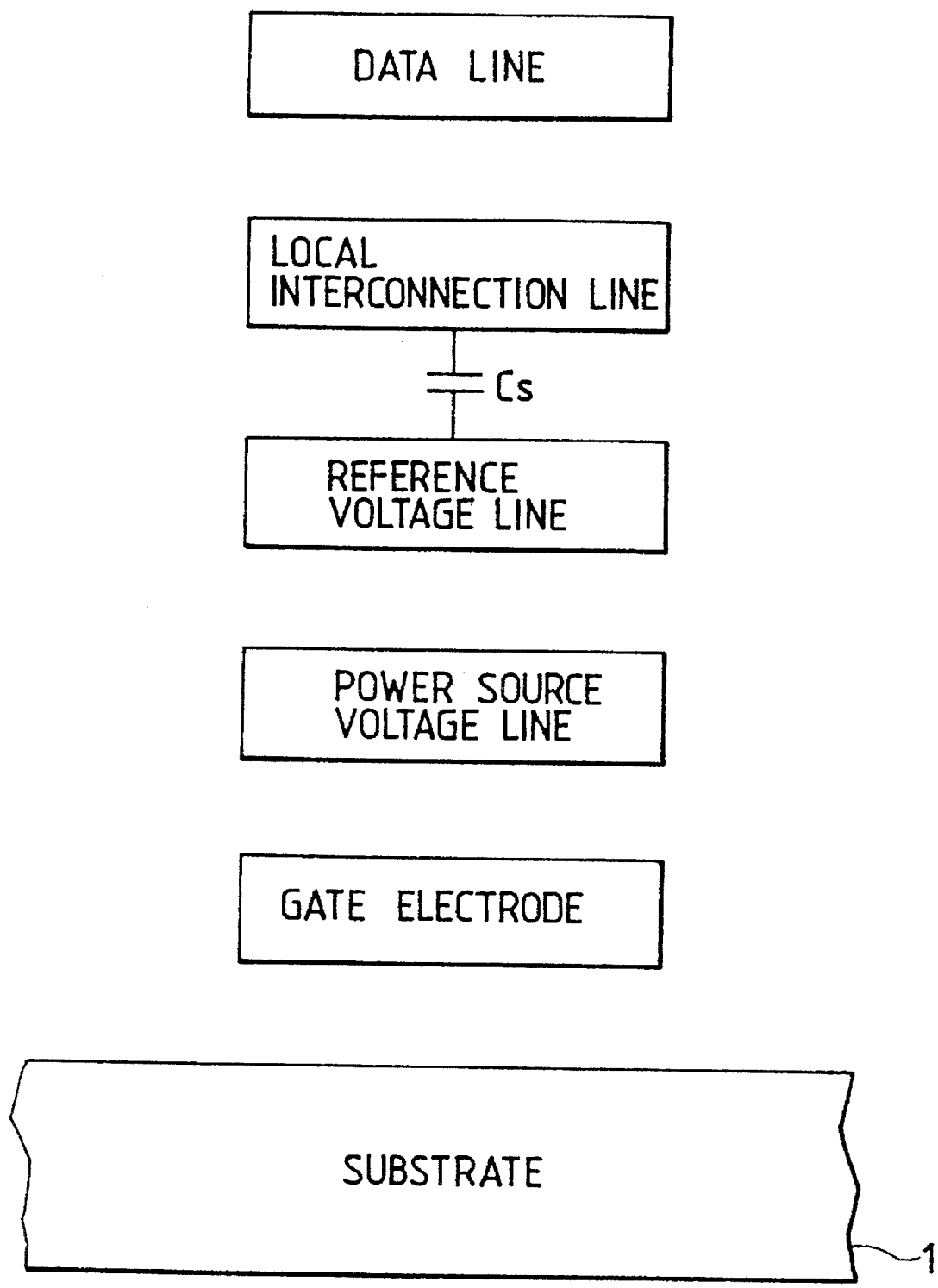
FIG. 9 is a schematic diagram showing the layered structure of the conductive layers which form the SRAM memory cell of the first embodiment.
Figure 10:
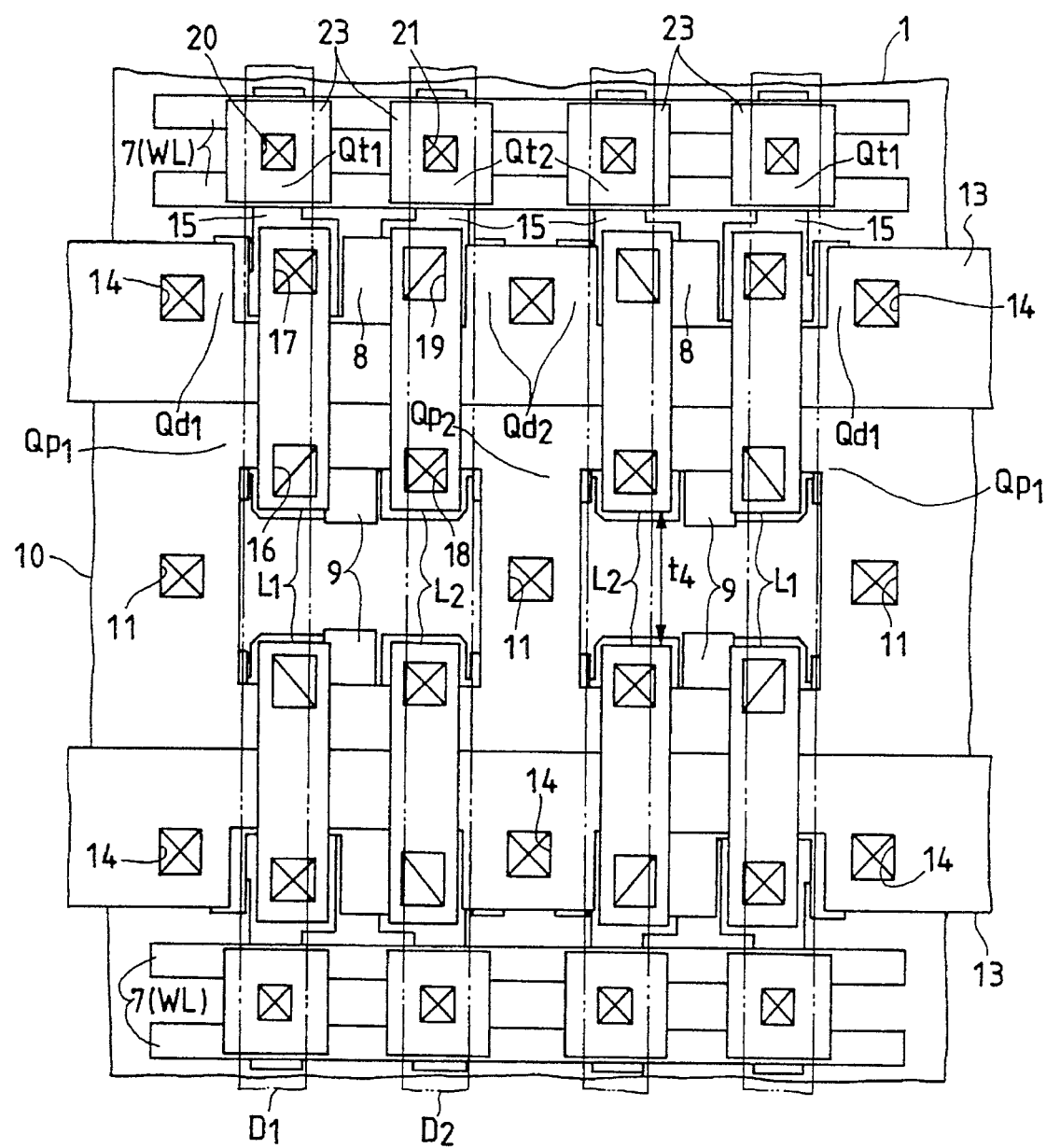
FIG. 10 is a plan view showing the layout of conductive layers for four SRAM memory cells of the first embodiment.

FIG. 9 shows the layered structure of the conductive layers in the memory cell MC of this embodiment, including the gate electrodes 7, 8, 9, the power source voltage line 10, the reference voltage line 13, the local interconnection lines $L_1$, $L_2$ and the complementary data lines (first data line $D_1$ and second data line $D_2$). The layout of the conductive layers for four memory cells MC is shown in FIG. 10.

Figure 37:
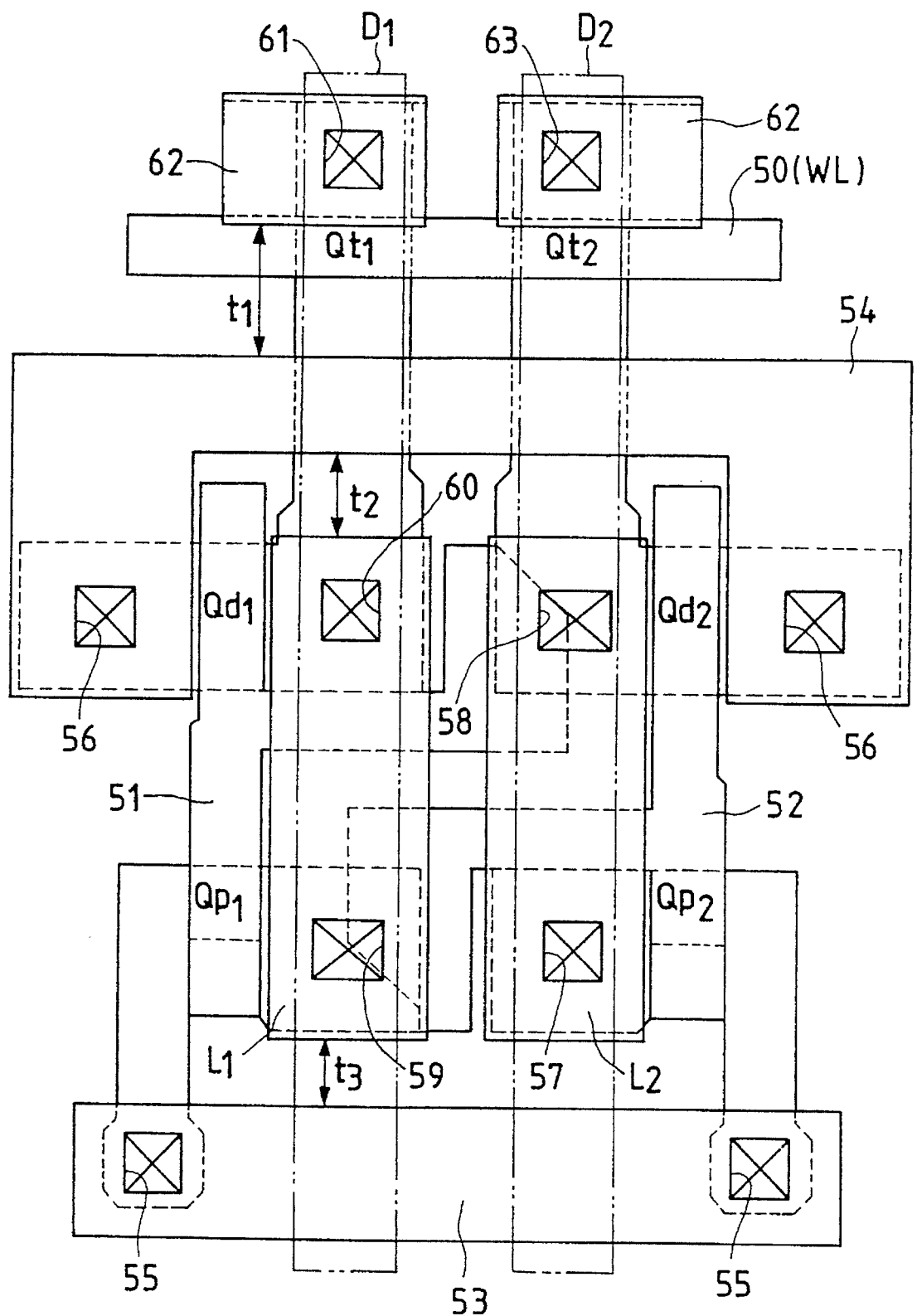
FIG. 37 is a plan view showing the layout of conductive layers forming the conventional SRAM memory cell.
Figure 38:
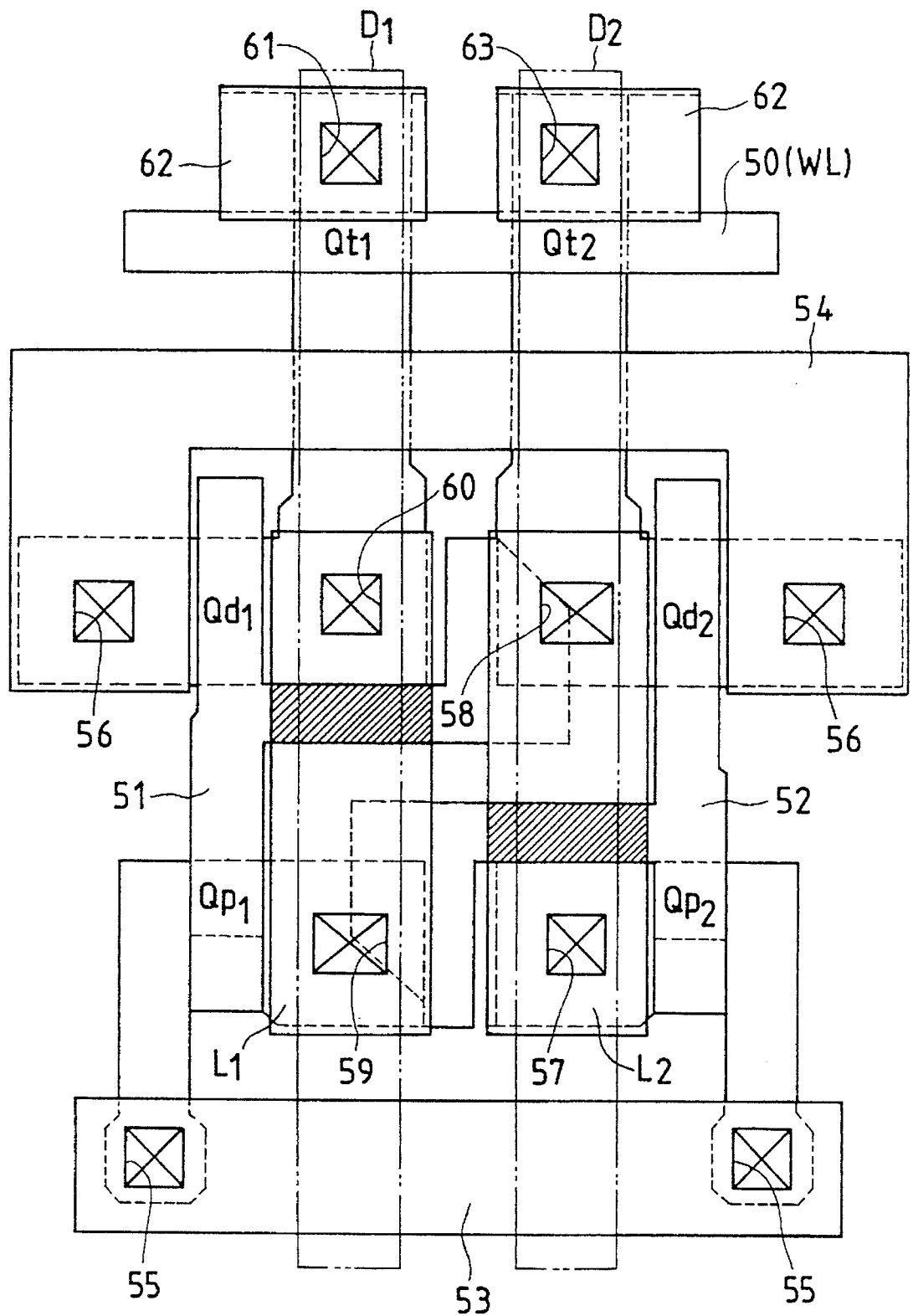
FIG. 38 is a plan view showing the layout of conductive layers forming the conventional SRAM memory cell.

In this way, the SRAM memory cell of this invention forms in different layers the power source voltage line 10, the reference voltage line 13 and the local interconnection lines $L_1$, $L_2$, all of which have been formed in the same conductive layer in the conventional fabrication technique. This eliminates limitation, due to the layout interval, on the memory cell size reduction, so that significant reduction of the area of the memory cell MC becomes possible. That is, with this embodiment, since restrictions arising from the intervals ($t_1$, $t_2$ shown in FIG. 37) required by the conventional art of FIGS. 7 and 8 are eliminated, it is possible to reduce the area of the memory cell MC to that extent. Further, as shown in FIGS. 6 and 10, restrictions stemming from the intervals ($t_3$ of FIG. 37) required by the conventional art no longer exist, reducing the area of the memory cell MC to that extent in more concrete terms, it is possible to make the interval ($t_4$) between adjacent memory cells MC smaller than is possible with the conventional art, as shown in FIG. 10. That is, the interval between memory cells MC ($t_4$) can be reduced down to the minimum fabrication dimensions.

Figure 11:
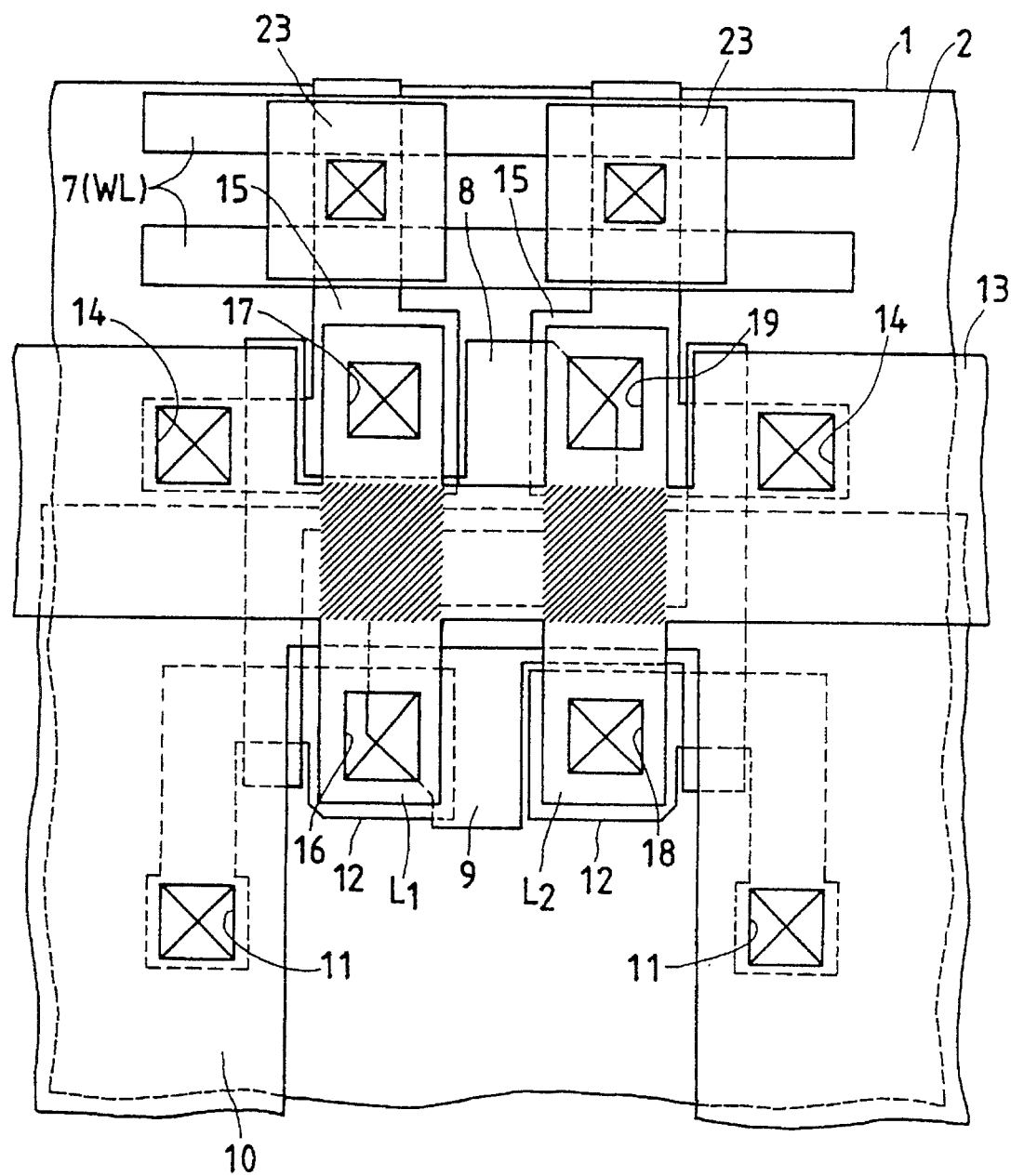
FIG. 11 is a plan view showing the layout of conductive layers which form the SRAM memory cell of the first embodiment.

The memory cell MC of this embodiment is arranged so that the local interconnection lines $L_1$, $L_2$, which are connected to the output nodes of the CMOS inverters ($INV_1$, $INV_2$) where information is stored, and the underlying reference voltage 13 cross each other. This arrangement allows the capacitance Cs formed in the overlapping area (shaded areas of FIG. 11) between the local interconnection lines $L_1$, $L_2$ and the underlying conductive layer (in this embodiment, the reference voltage line 13) to be increased which, in turn, increases the accumulated electric charge. As a result, when the memory cell MC is reduced in size, the information can be retained stably and the operation reliability secured.

Figure 12:
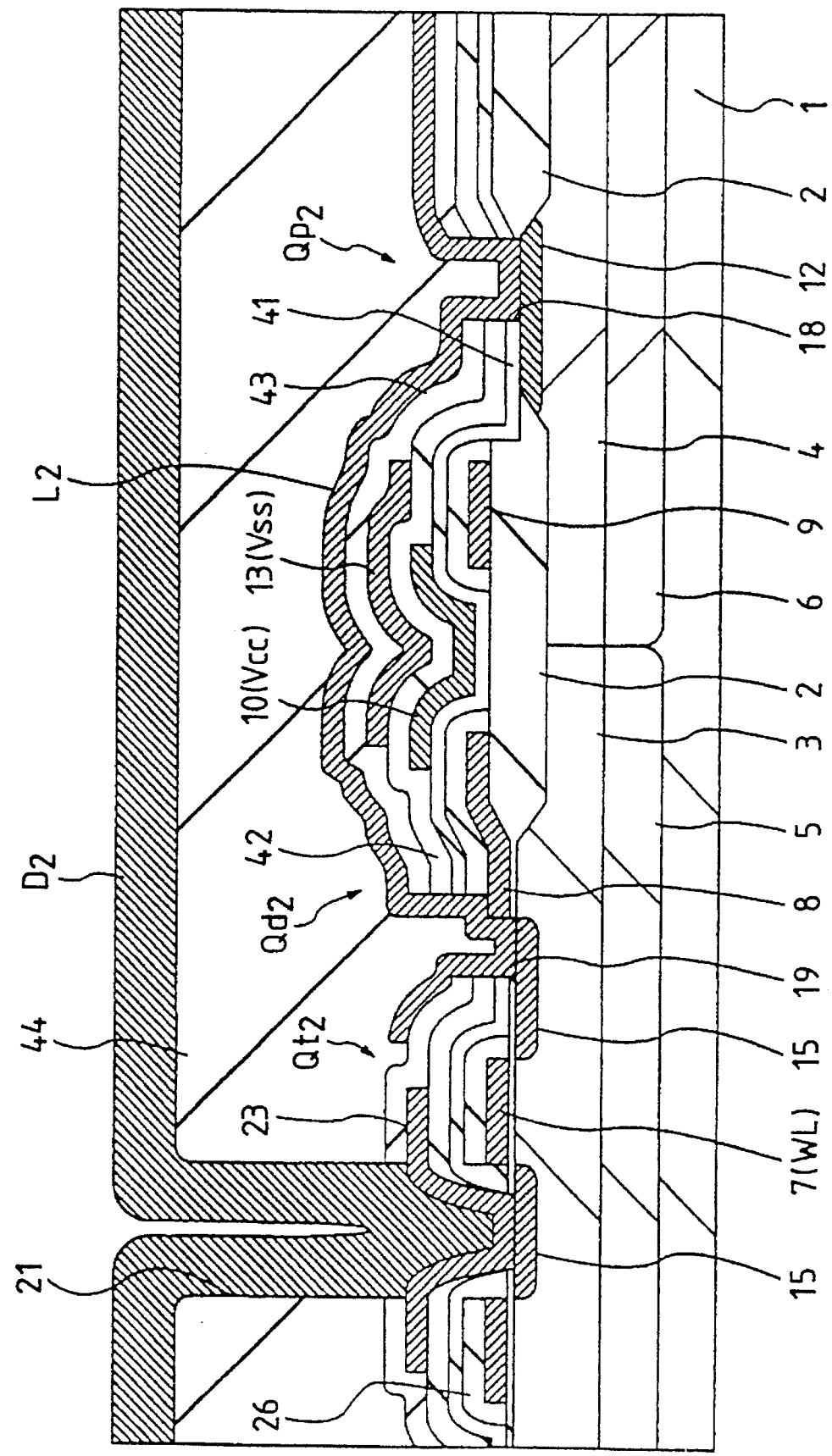
FIG. 12 is a cross section of a semiconductor chip (substrate) showing the SRAM memory cell of a second embodiment of this invention.
Figure 13:
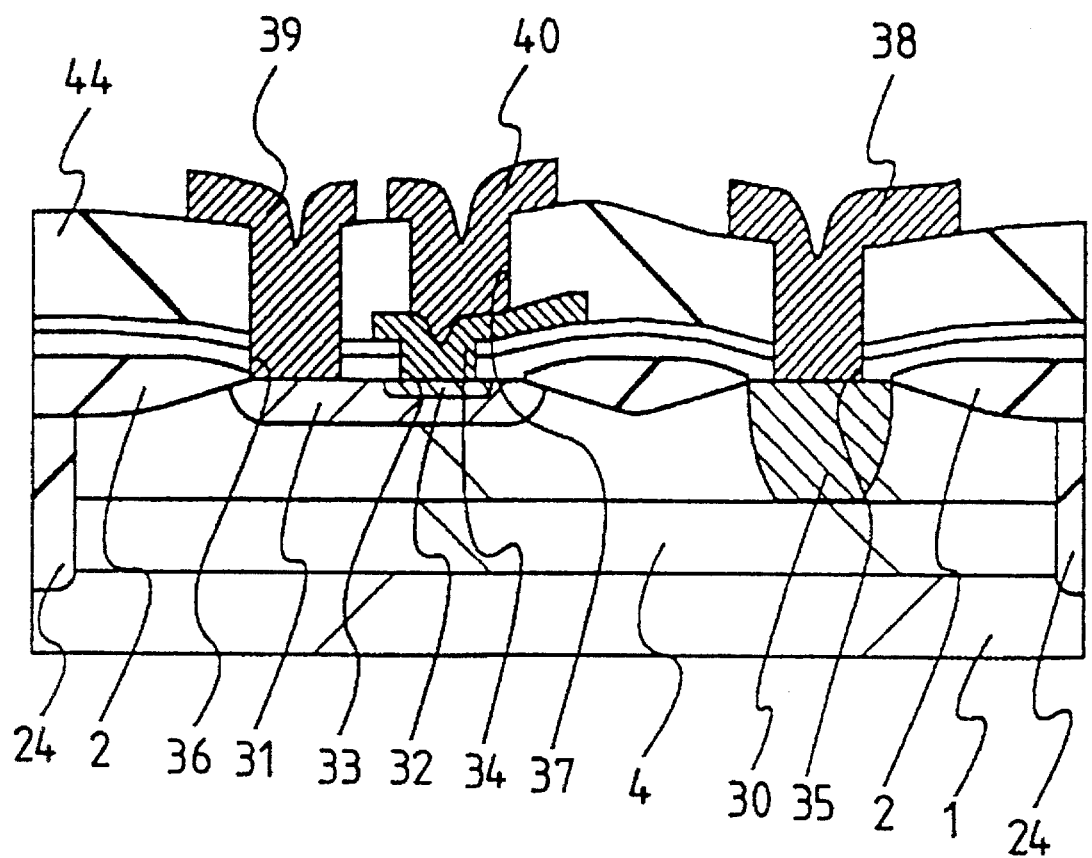
FIG. 13 is a cross section of a semiconductor chip (substrate) showing a part of the peripheral circuit for the SRAM memory cell of the second embodiment.

The memory cell MC of this embodiment is not limited to the above configuration. When, for example, a part of the peripheral circuit is formed of a bipolar CMOS circuit as shown in FIG. 12, it is possible to deposit a $p^+$-type embedded layer 5 under the p-type well 3 of the semiconductor 1 and an $n^+$-type embedded layer 6 under the n-type well 4. In this case, the peripheral circuit is formed, for example, with an npn-type bipolar transistor Qb of FIG. 13.

The bipolar CMOS processing technique is disclosed in U.S. Pat. No. 4,853,343 and U.S. Pat. No. 5,057,894. The contents of which are incorporated herein by reference.

In the figure, denoted 30 is an $n^+$-type semiconductor region that forms the collector leadout region, 31 a $p^+$-type semiconductor forming the base region, and 32 an $n^+$-type semiconductor region forming the emitter region. The $n^+$-type semiconductor region 32 is connected with an emitter leadout electrode 34 through the connection hole 33. The emitter leadout electrode 34 is formed of the same third-layer polycide film (or a laminated film of a polycrystalline silicon film and a high melting point metal film) that is used for the reference voltage line 13 of the memory cell MC. The collector leadout region 30, base region 31 and emitter leadout electrode 34 are connected with interconnection lines 38, 39, 40 through the connection holes 35, 36, 37, respectively. These interconnection lines 38, 39, 40 are formed of the same second-layer metal film that is used for the complementary data lines (first data line $D_1$ and second data line $D_2$) of the memory cell MC.

Figure 14:
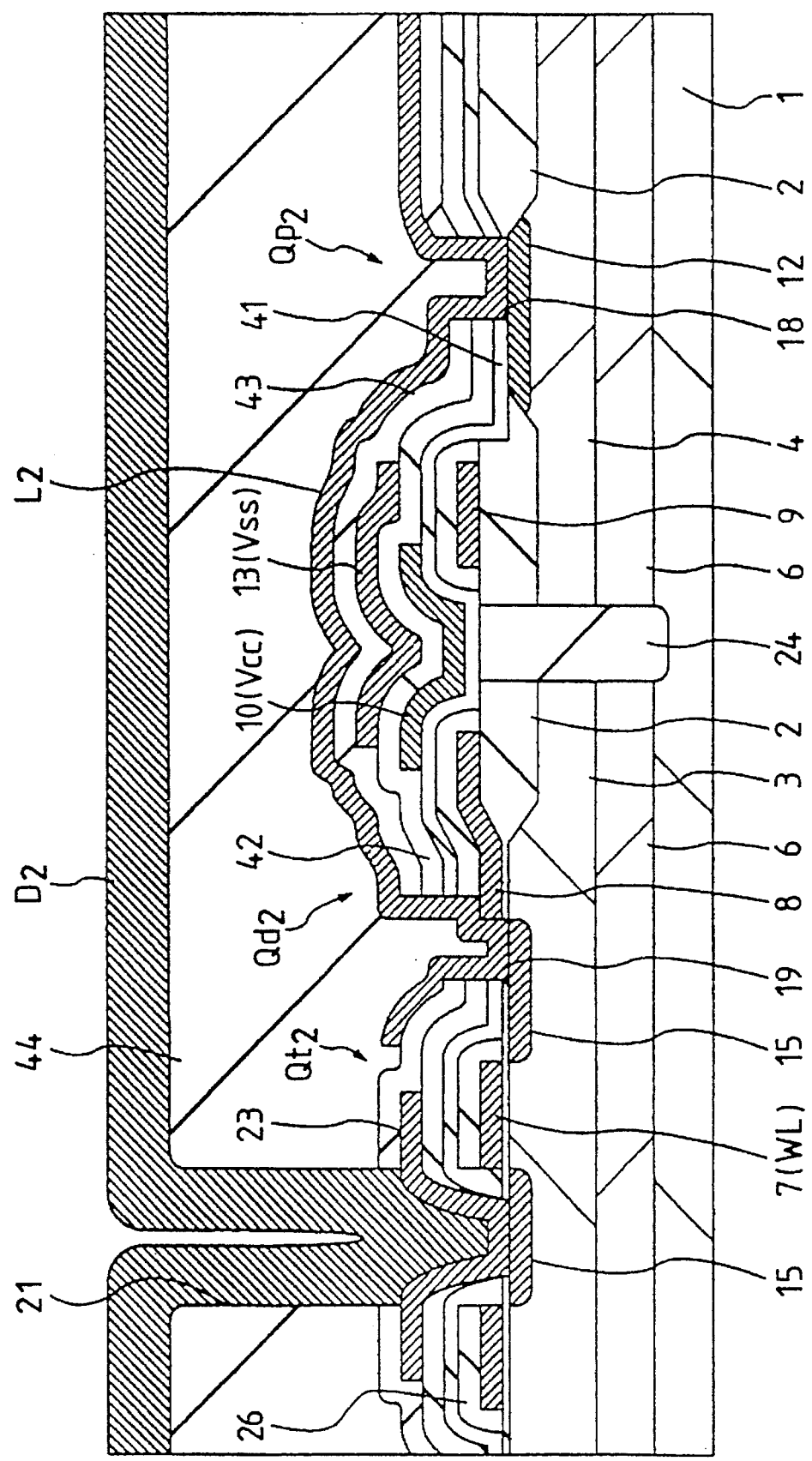
FIG. 14 is a cross section of a semiconductor chip (substrate) showing the SRAM memory cell of the second embodiment.

When a part of the peripheral circuit is to be formed of a bipolar CMOS circuit, a U-groove 24 for device isolation reaching the semiconductor substrate 1 may be formed in the field insulation film 2 at the boundary between the p-type well 3 and the n-type well 4, as shown in FIG. 14. Embedded inside the U-groove 24 is an insulation film such as silicon oxide. In this case, since the well and the embedded layer are reliably isolated by the U-groove 24, there is no need to form the $p^+$-type embedded layer 5 under the p-type well 3. That is, what is needed to be formed under the p-type well 3 is the same $n^+$-type embedded layer 6 as is formed under the n-type well 4, so that the process to form the $p^+$-type embedded layer 5 becomes unnecessary, shortening the SRAM fabrication process.

Figure 15:
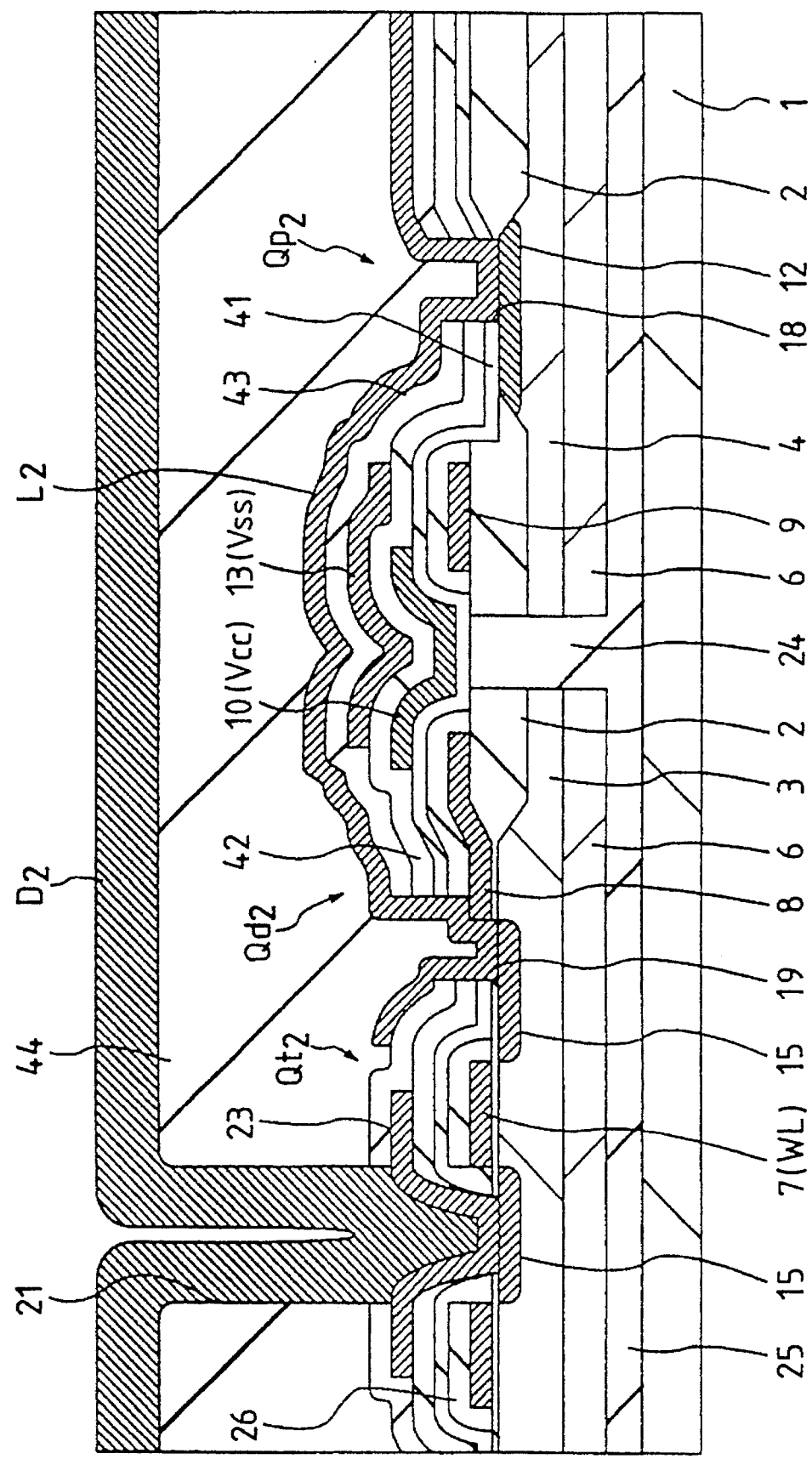
FIG. 15 is a cross section of a semiconductor chip (substrate) showing the SRAM memory cell of the second embodiment.

Further, as shown in FIG. 15, it is also possible to form the SRAM of this embodiment on a so-called SOI (Silicon On Insulator) substrate, in which an insulation film 25 such as silicon oxide is provided between the $n^+$-type embedded layer 6 and the semiconductor substrate 1. In this case, the substrate capacity can be reduced, improving the operation speed of the SRAM. Further, it is also possible to improve the latch-up resistance of the CMOS circuit, enhancing the α ray soft error resistance of the memory cell MC.

Embodiment 2

Figure 17:
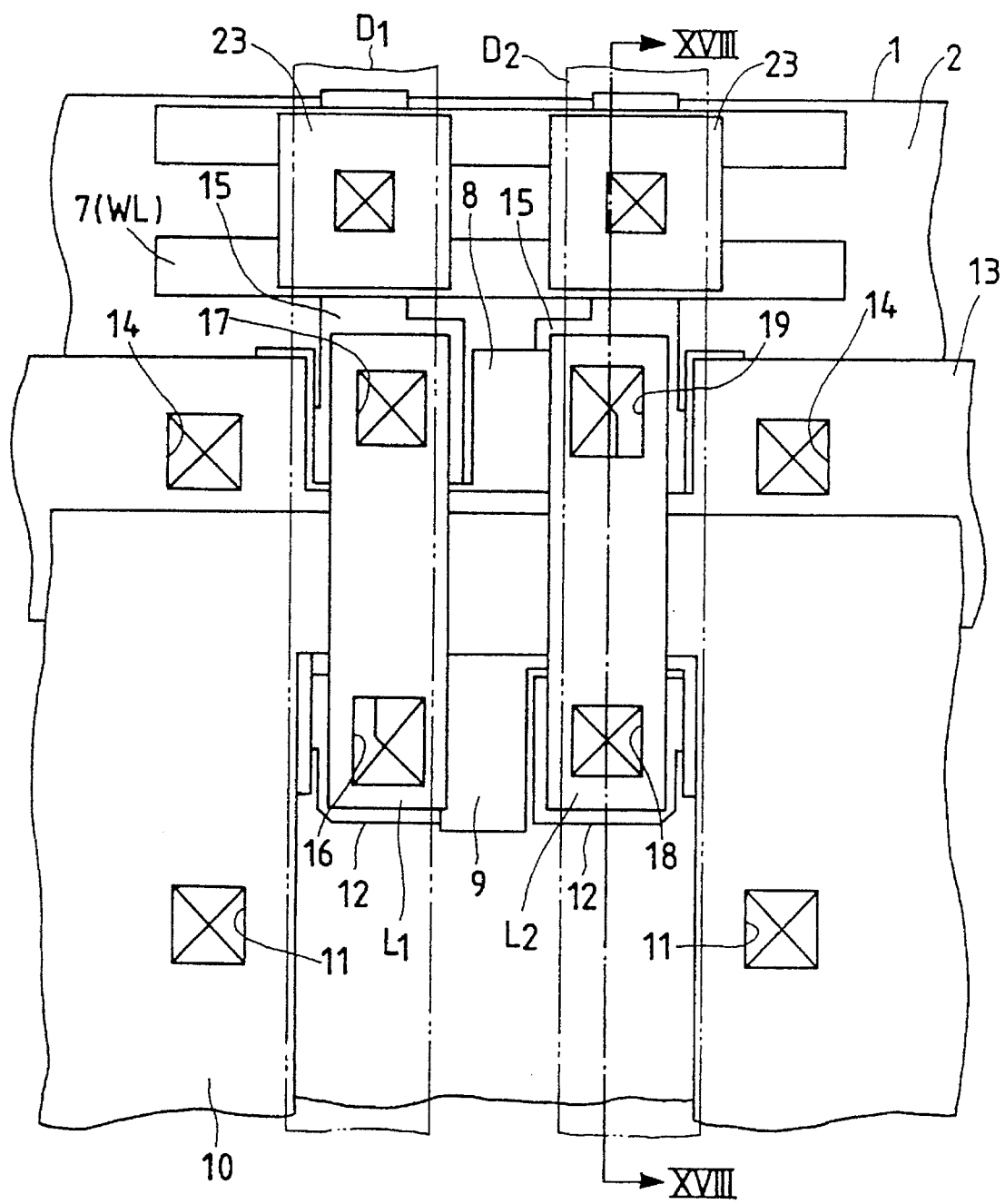
FIG. 17 is a plan view showing the layout of conductive layers forming the SRAM memory cell of the second embodiment.
Figure 18:
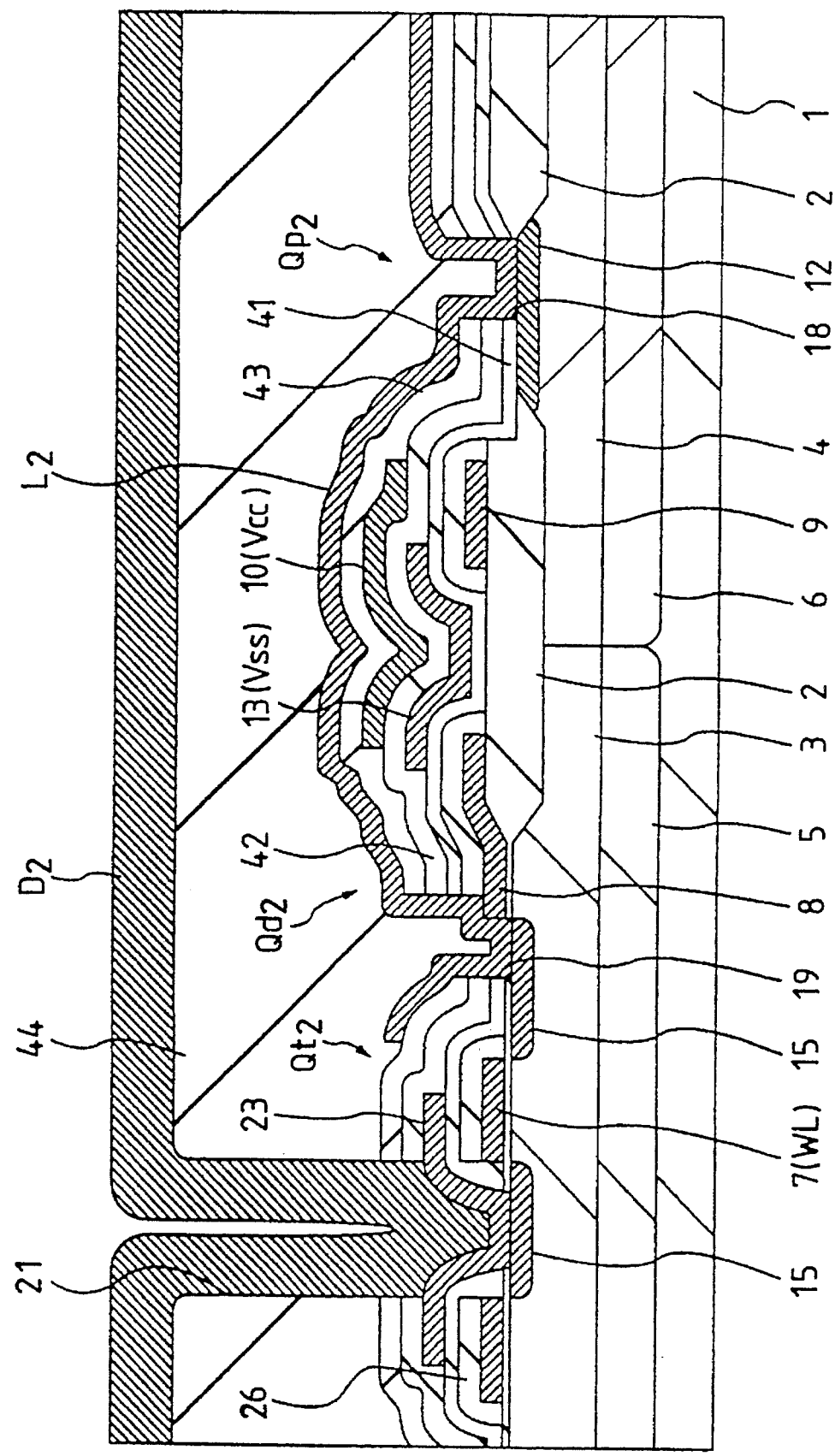
FIG. 18 is a cross section of the semiconductor chip (substrate) taken along the line XVIII—XVIII of FIG. 17.
Figure 19:
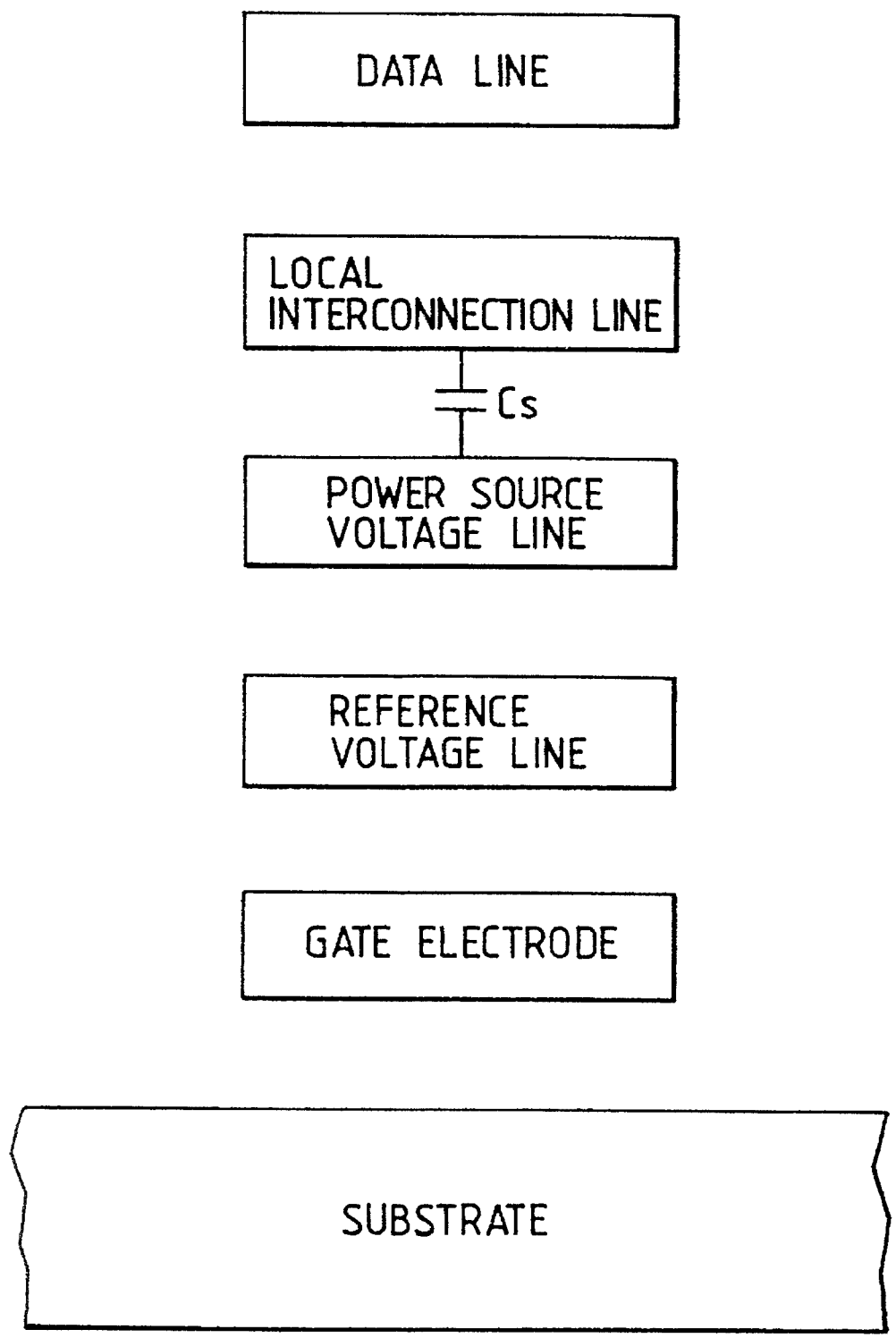
FIG. 19 is a schematic diagram showing the layered structure of the conductive layers which form the SRAM memory cell of the second embodiment.

FIG. 17 is a plan view showing the layout of the conductive layers making up the memory cell MC of this embodiment. FIG. 18 is across section of the semiconductor chip (substrate) 1 taken along the line XVIII—XVIII of FIG. 17. FIG. 19 is a schematic diagram showing the layered structure of the conductive layers.

The memory cell MC of the first embodiment has the reference voltage line 13 formed over the power source voltage line 10 and also has the local interconnection lines $L_1$, $L_2$ formed over the reference voltage line 13. In the memory cell MC of the second embodiment, however, over the reference voltage line 13 is formed the power source voltage line 10, on which the local interconnection lines $L_1$, $L_2$ are deposited.

That is, the memory cell of this embodiment, as shown in FIGS. 17 through 19, has the reference voltage line 13 formed of the second-layer polycrystalline silicon film (or polycide film) and deposited over the gate electrodes 7, 8, 9 of the six MISFETs that make up the memory cell MC. Deposited over the reference voltage line 13 is the power source voltage line 10 made of the third-layer polycide film (or a laminated film of a polycrystalline silicon film and a high melting point metal film), over which the local interconnection lines $L_1$, $L_2$ made of the first-layer metal film is deposited. The pair of local interconnection lines $L_1$, $L_2$ and the underlying power source voltage line 10 are made to intersect each other on the memory cell MC.

In this embodiment with the above configuration, because the reference voltage line 13, the power source voltage line 10 and the local interconnection lines $L_1$, $L_2$ are formed in different conductive layers, restrictions on the size reduction of memory cell MC arising from the layout intervals are removed, significantly reducing the area of the memory cell MC.

Figure 20:
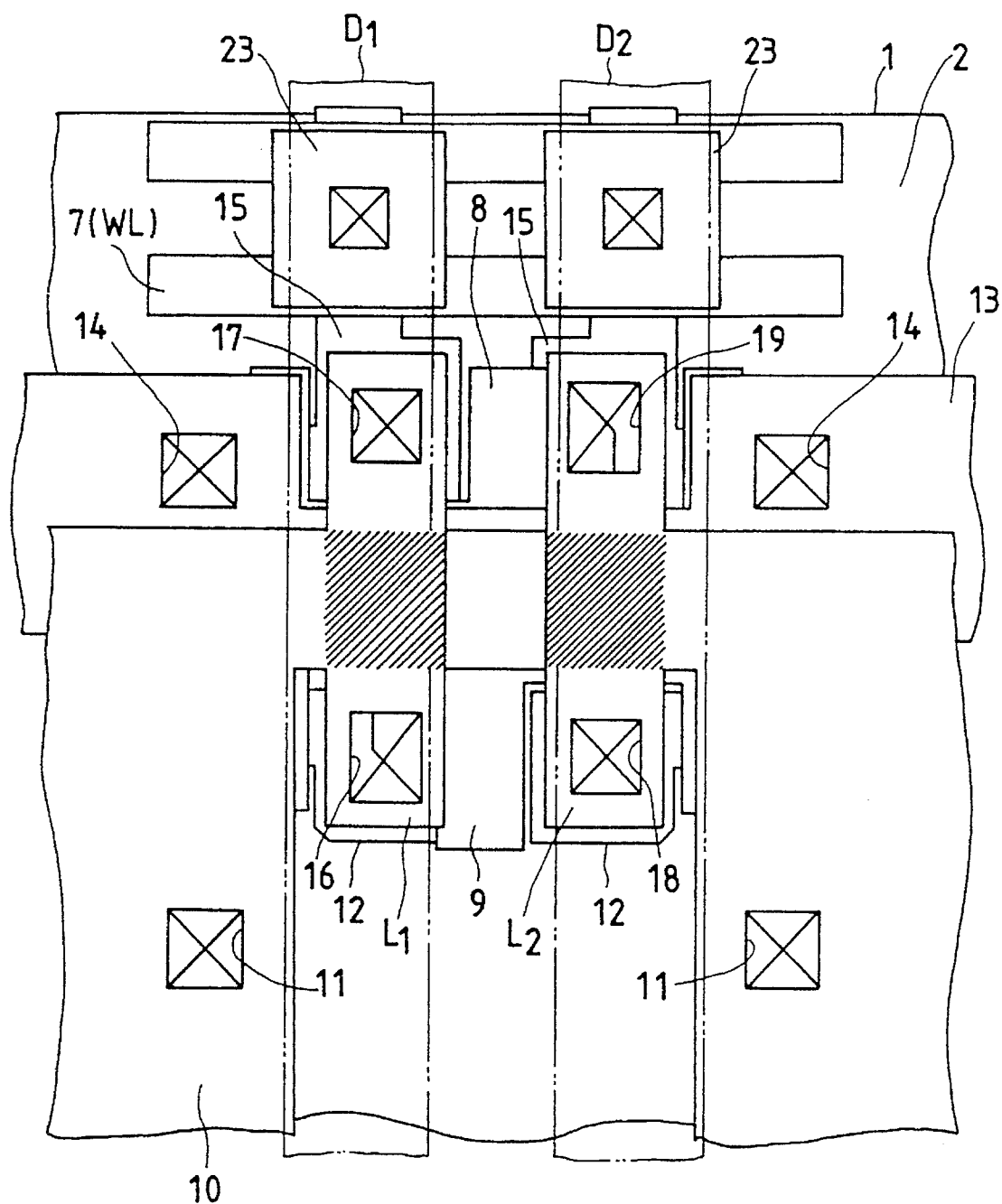
FIG. 20 is a plan view showing the layout of conductive layers forming the SRAM memory cell of the second embodiment.

Further, with this embodiment, because the local interconnection lines $L_1$, $L_2$ and the underlying power source voltage line 10 are arranged to cross each other, the capacitance Cs formed in the overlapping area of these lines (shaded area of FIG. 20) can be increased to increase the accumulated electric charge. This in turn enables information to be held stably even when the size of memory cell MC is reduced, thus assuring reliable operation.

Embodiment 3

Figure 21:
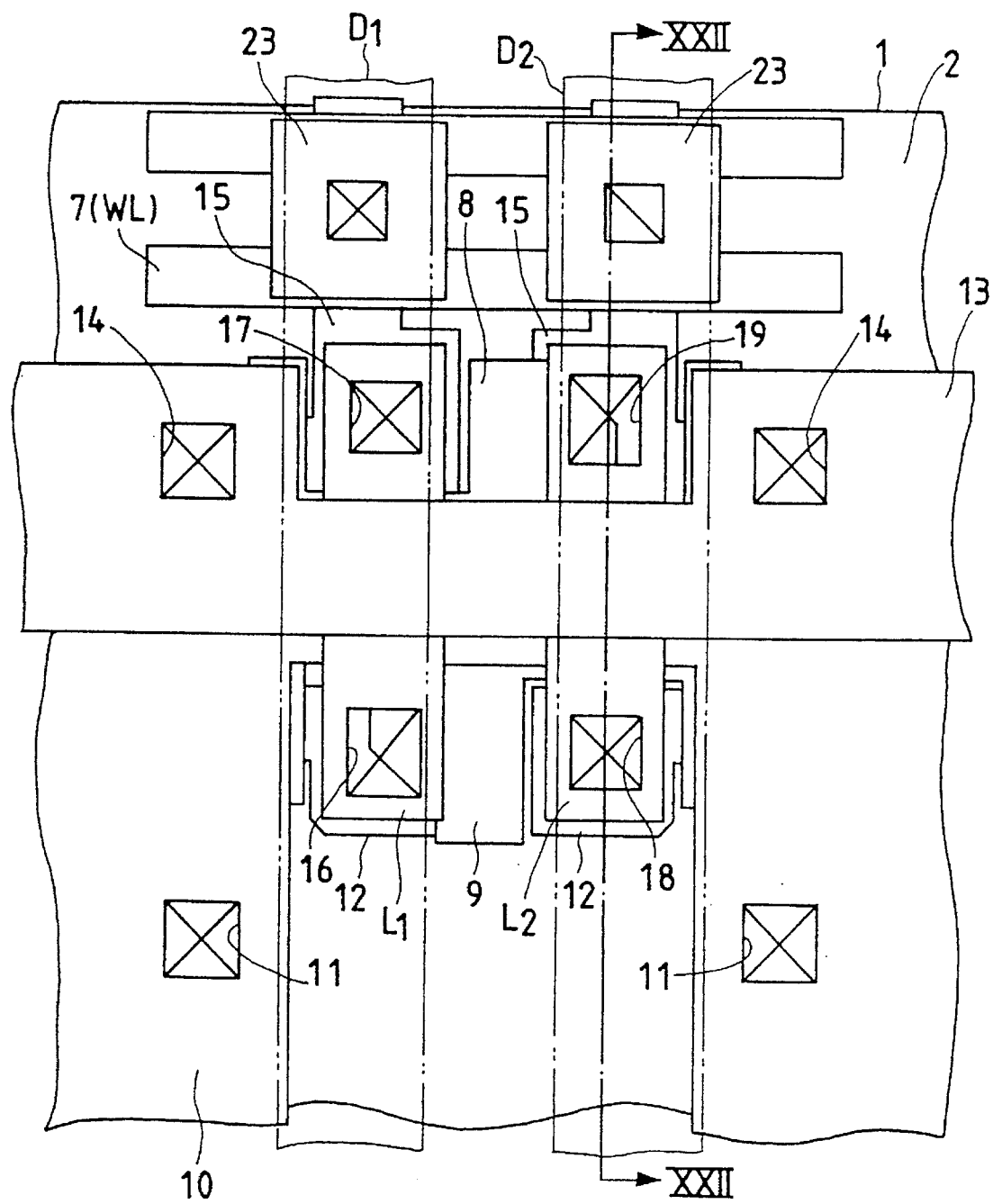
FIG. 21 is a plan view showing the layout of conductive layers forming the SRAM memory cell of a third embodiment.
Figure 22:
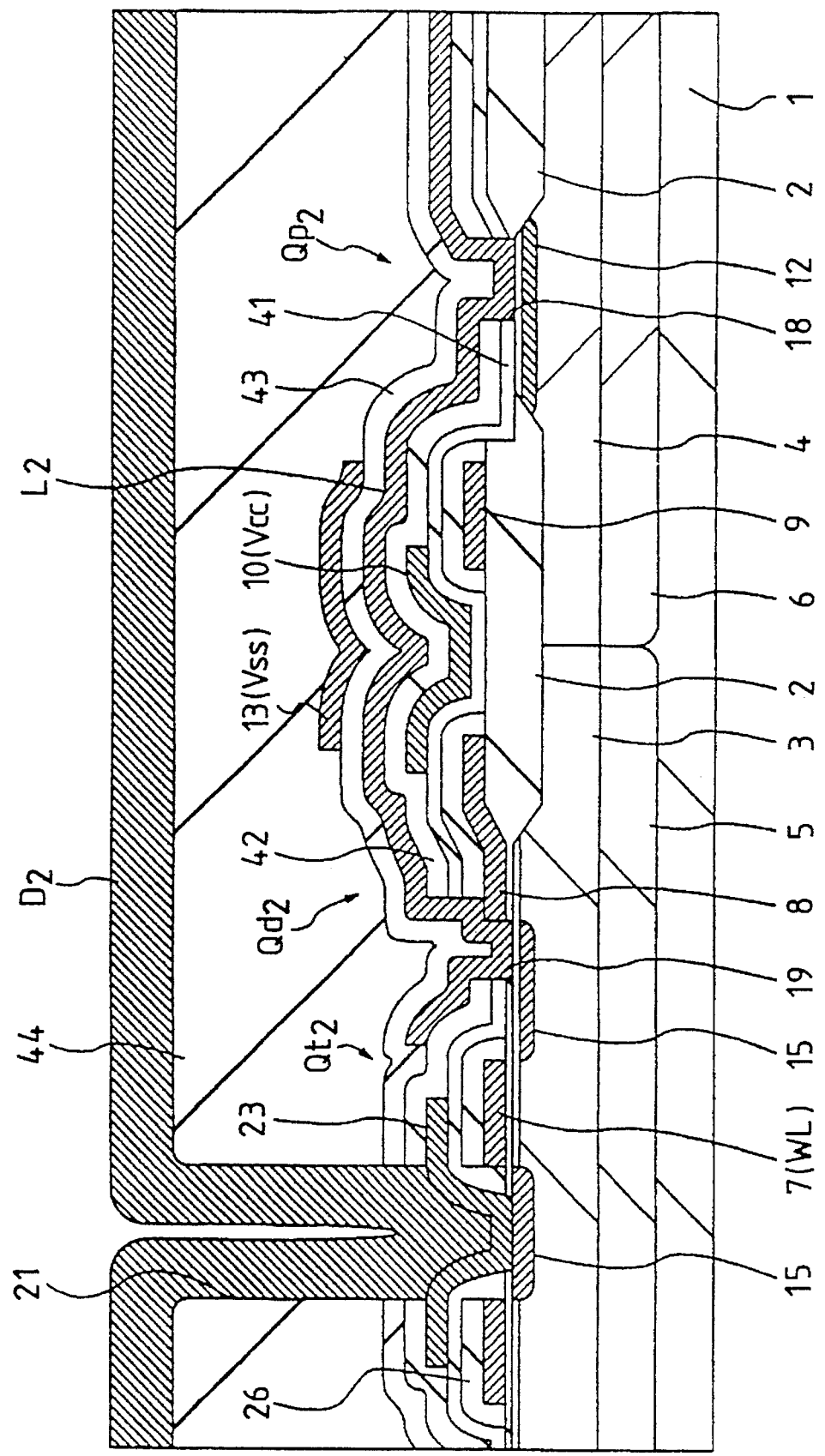
FIG. 22 is a cross section of the semiconductor chip (substrate) taken along the line XXII—XXII of FIG. 21.
Figure 23:
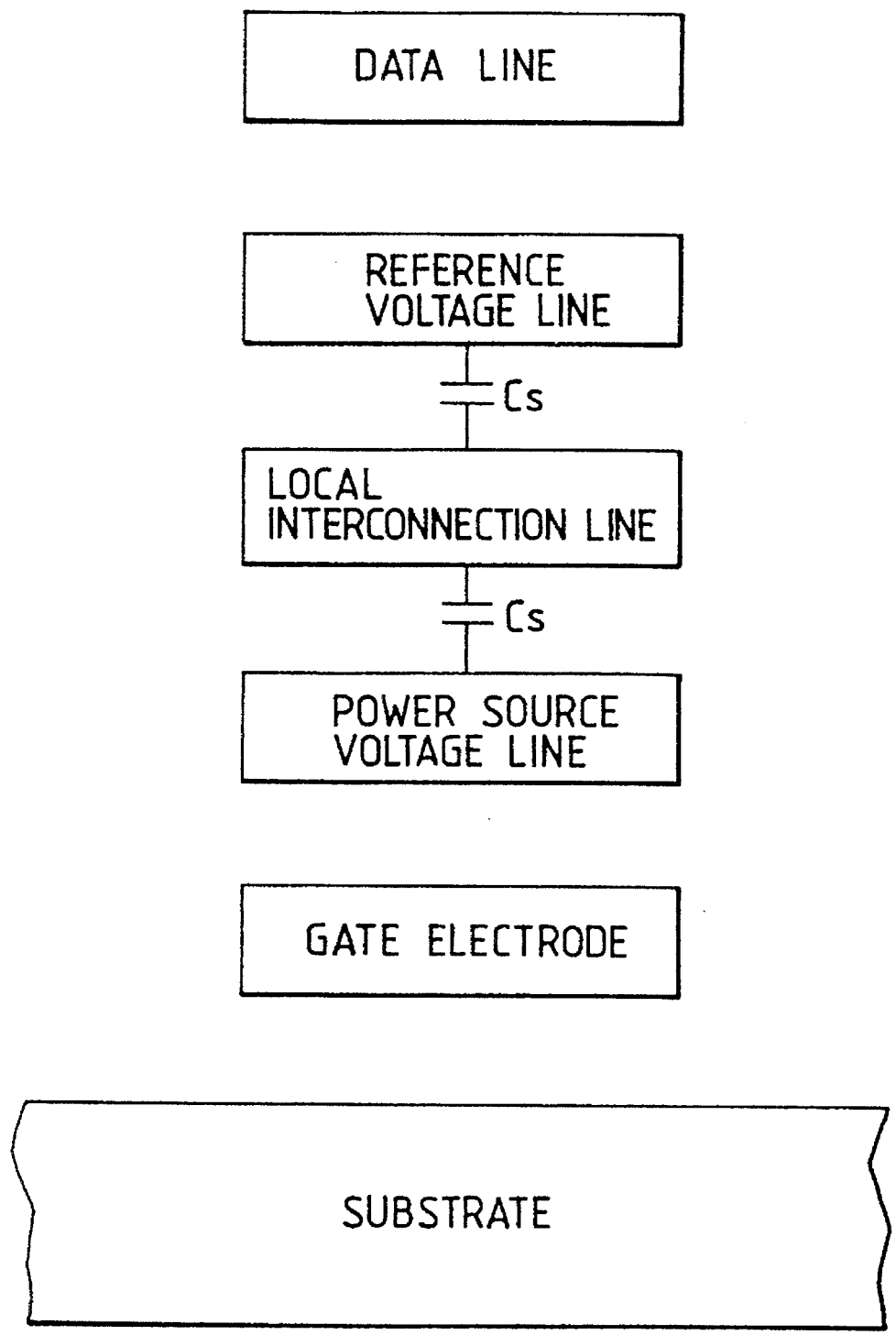
FIG. 23 is a schematic diagram showing the layered structure of the conductive layers which form the SRAM memory cell of the third embodiment.

FIG. 21 is a plan view showing the layout of conductive layers which form the memory cell MC of this embodiment. FIG. 22 is a cross section of the semiconductor chip (substrate) taken along the line XXII—XXII of FIG. 21. FIG. 23 is a schematic diagram showing the layered structure of the conductive layers.

As shown in FIG. 21 to 23, the memory cell MC of this embodiment has the power source voltage line 10 formed of the second-layer polycrystalline silicon film (polycide film) and deposited over the gate electrodes 7, 8, 9 of the six MISFETs that form the memory cell MC. Over the power source voltage line 10 are deposited the local interconnection lines $L_1$, $L_2$ which are made of the third-layer polycide film (or a laminated film of a polycrystalline silicon film and a high melting point metal film). The reference voltage line 13 is formed of the first-layer metal film and deposited over the local interconnection lines $L_1$, $L_2$. The local interconnection lines $L_1$, $L_2$ are so arranged as to cross the power source voltage line 10 and the reference voltage line 13, respectively, on the memory cell MC.

Since this embodiment with the above configuration has the power source voltage line 10, the local interconnection lines $L_1$, $L_2$ and the reference voltage line 13 formed on different conductive layers, limitations on the memory cell size reduction due to the layout intervals of these conductive layers no longer exist, thus allowing a substantial reduction of the memory cell area.

Because this embodiment forms a capacitance Cs between the local interconnection lines $L_1$, $L_2$ and the underlying power source voltage line 10 and also a capacitance Cs between the local interconnection lines $L_1$, $L_2$ and the overlying reference voltage line 13, it is possible to increase the accumulated electric charge in the memory cell MC significantly. This in turn allows information to be retained in the memory cell MC even when the memory cell MC is reduced in size, thus securing the operation reliability.

The similar effects of this embodiment can be obtained if the power source voltage line 10 and the reference voltage line 13 are arranged opposite to what is described above. That is, it is possible to deposit the reference voltage line 13 made of the second-layer polycrystalline silicon film (or polycide film) over the gate electrodes 7, 8, 9, deposit over the reference voltage line 13 the local interconnection lines $L_1$, $L_2$ made of the third-layer polycide film (or a laminated film of a polycrystalline silicon film and a high melting point metal film), and deposit over the local interconnection lines $L_1$, $L_2$ the power source voltage line 10 made of the first-layer metal film, in such a way that the local interconnection lines $L_1$, $L_2$ intersect the power source voltage line 10 and the reference voltage line 13, respectively, on the memory cell MC.

Embodiment 4

Figure 24:
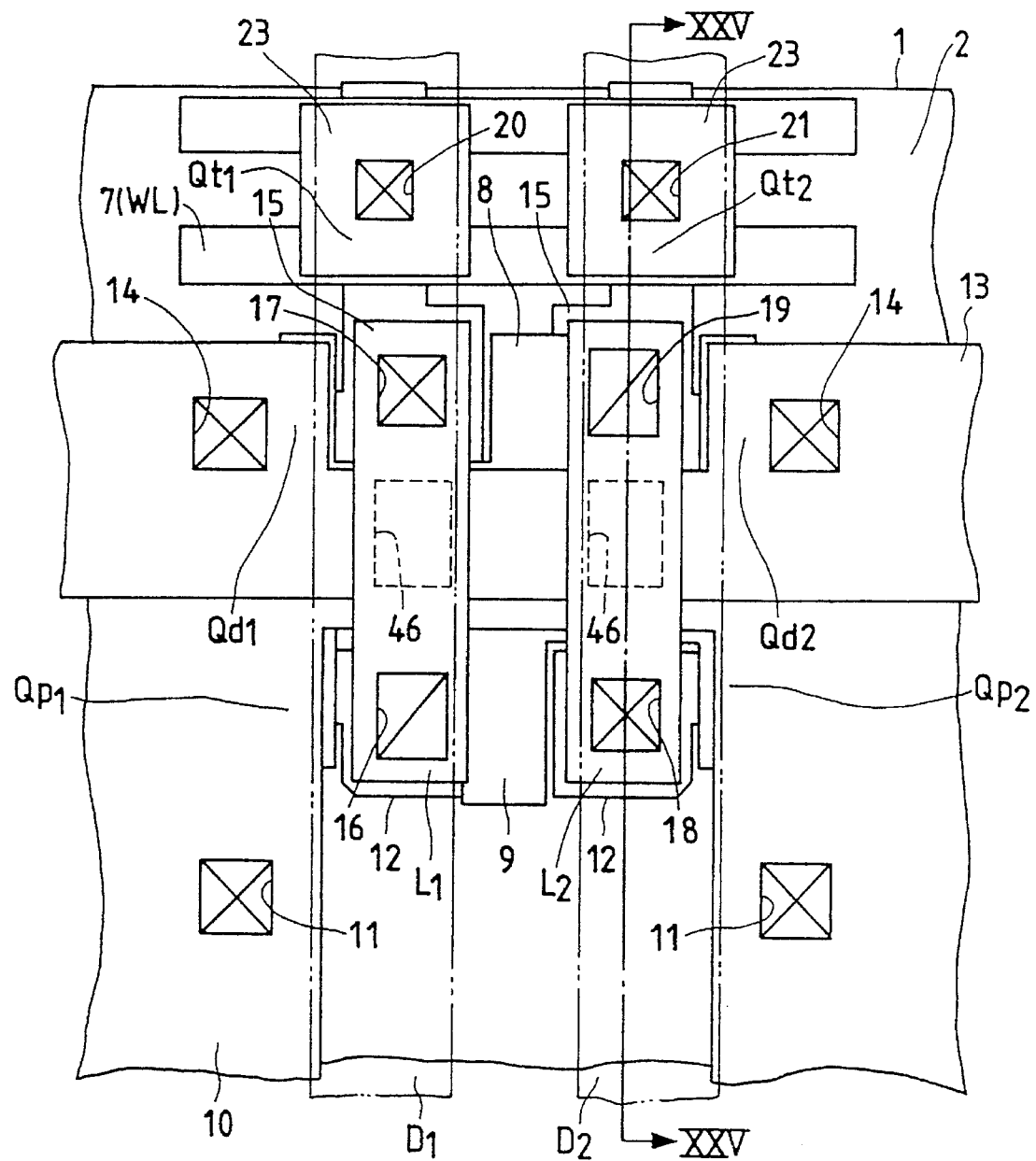
FIG. 24 is a plan view showing the layout of conductive layers forming the SRAM memory cell of a fourth embodiment.
Figure 25:
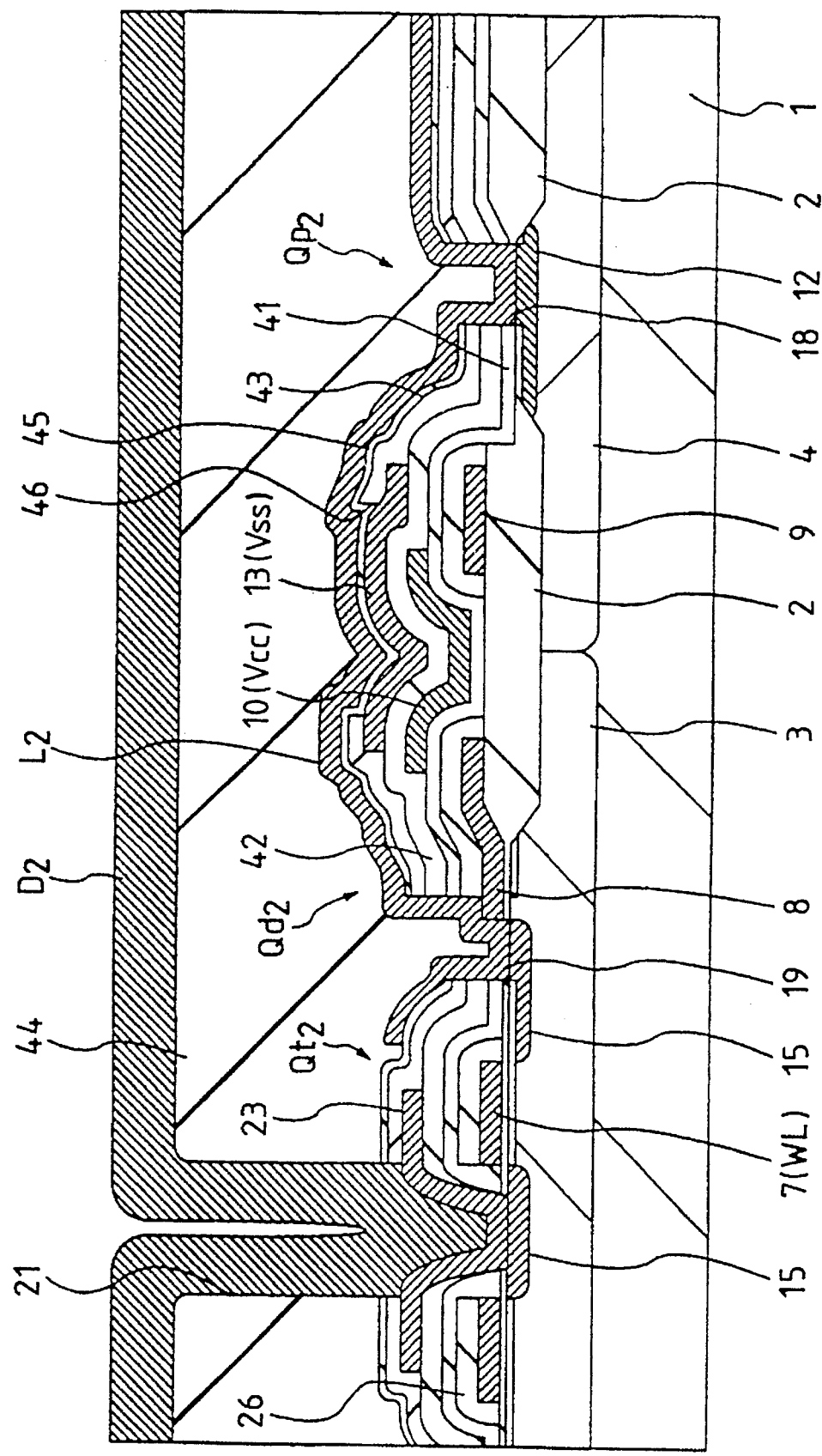
FIG. 25 is a cross section of the semiconductor chip (substrate) taken along the line XXV—XXV of FIG. 24.

FIG. 24 is a plan view showing the layout of the conductive layers forming the memory cell MC of this embodiment. FIG. 25 is a cross section of the semiconductor chip (substrate) 1 taken along the line XXV—XXV of FIG. 24.

In the memory cell of the fourth embodiment, as in the first embodiment, the power source voltage line 10 is formed over the gate electrodes 7, 8, 9; the reference voltage line 13 is formed over the power source voltage line 10; and the local interconnection lines $L_1$, $L_2$ are formed over and crossing the reference voltage line 13. A connection hole 46 is formed in the insulating film 43 of silicon oxide deposited over the reference voltage line 13. And a silicon nitride film 45 (or a laminated film of silicon nitride film and silicon oxide film) is deposited thinly over the insulation film 43. As a result, the local interconnection lines $L_1$, $L_2$ are formed inside the connection hole 46 over the reference voltage line 13 through the silicon nitride film 45.

In this embodiment, with the insulation film between the reference voltage line 13 and the local interconnection lines $L_1$, $L_2$ formed of the silicon nitride film 45, a material having a higher dielectric constant than the silicon oxide film, it is possible to make the capacitance Cs between the reference voltage line 13 and the local interconnection lines $L_1$, $L_2$ larger than that of the memory cell MC of the first embodiment. Thus, it is possible to increase the accumulated electric charge in the memory cell MC, allowing information to be retained in the memory cell even when the memory cell is reduced in size and thereby ensuring its reliable operation.

When the capacitance Cs is formed between the local interconnection lines $L_1$, $L_2$ and the power source voltage line 10 as in the case of the second embodiment, the similar effects to those of this embodiment can be produced by forming the connection hole 46 in the insulation film 43 of silicon oxide lying over the power source voltage line 10 and by thinly depositing the silicon nitride film 45 over the insulation film 43.

Embodiment 5

Figure 26:
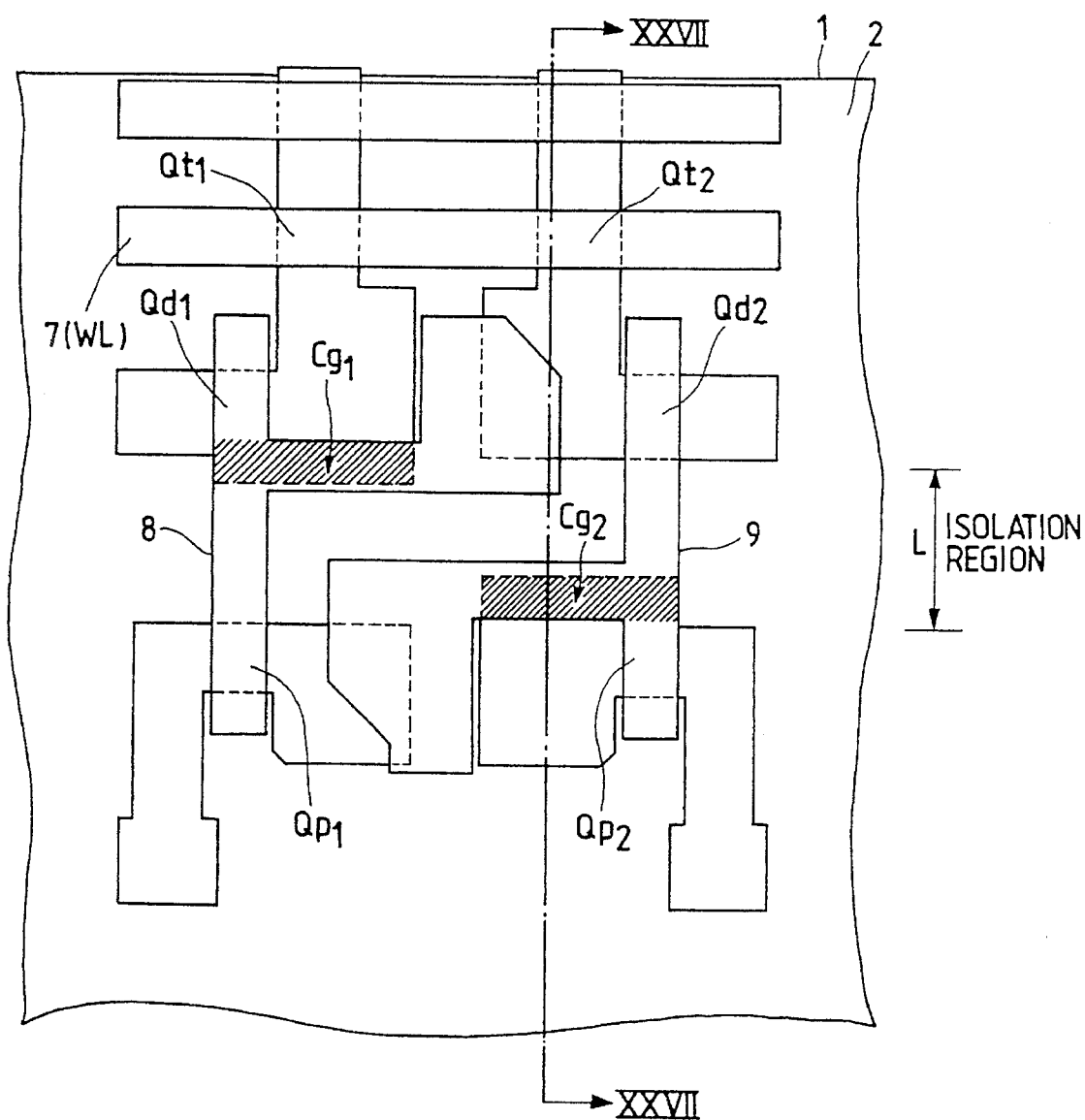
FIG. 26 is a plan view showing the layout of conductive layers forming the SRAM memory cell of a fifth embodiment.
Figure 27:
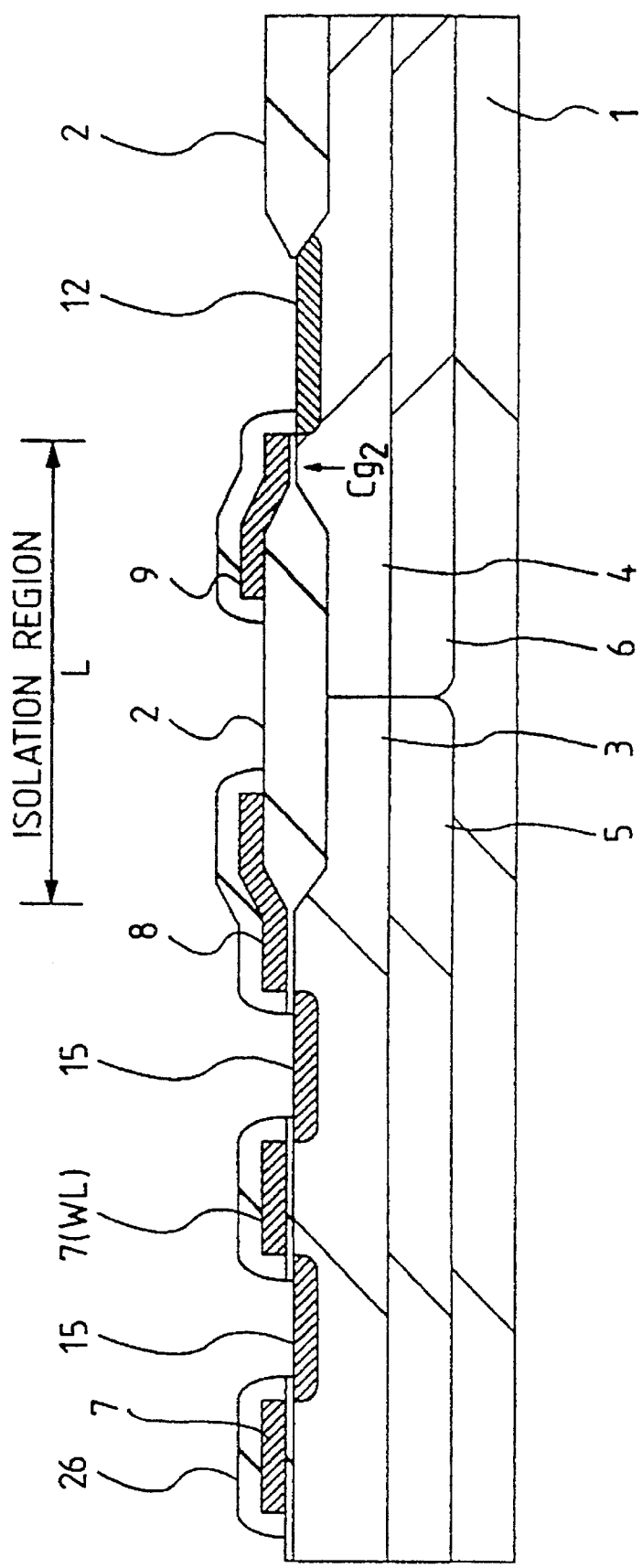
FIG. 27 is a cross section of the semiconductor chip (substrate) taken along the line XXVII—XXVII of FIG. 26.
Figure 28:
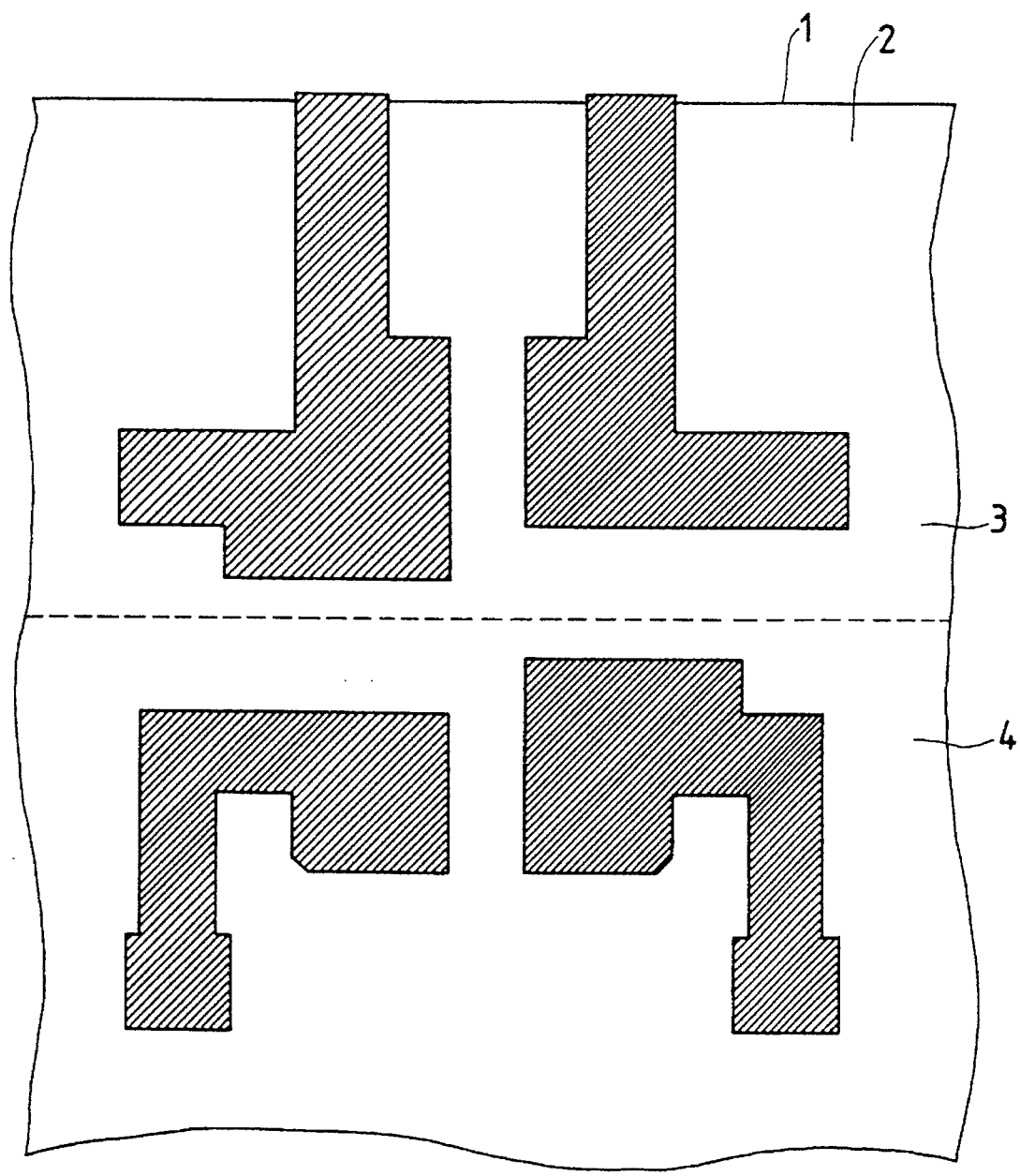
FIG. 28 is a plan view showing the layout of conductive layers of FIG. 26 deposited on one layer of the semiconductor chip.
Figure 29:
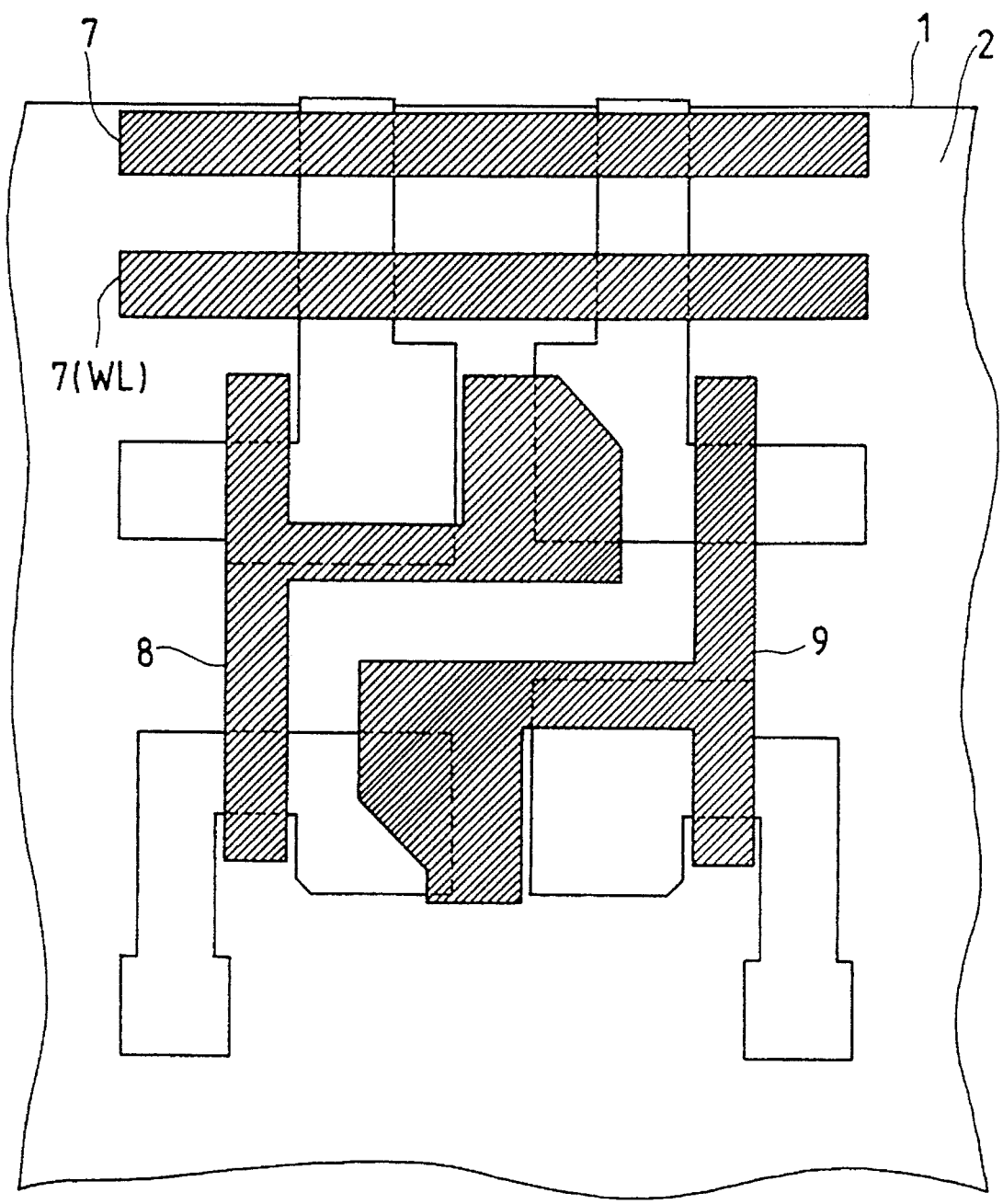
FIG. 29 is a plan view showing the layout of conductive layers of FIG. 26 deposited on another layer of the semiconductor chip.

FIG. 26 is a plan view showing the layout of conductive layers forming the memory cell MC of this embodiment. FIG. 27 is a cross section of the semiconductor chip (substrate) 1 taken along the line XXVII—XXVII of FIG. 26. FIGS. 28 and 29 are plan views showing the layout of conductive layers of FIG. 26 on each level. The configurations of conductive layers formed on layers above the first conductive film are the same as explained in the first to fourth embodiment, and therefore their drawings are not presented.

As shown in FIGS. 26 to 29, the memory cell MC of this embodiment sets back the field insulating film 2 on the diagonal line of the isolation region for the driver MISFETs $Qd_1$, $Qd_2$ and the load MISFETs $Qp_1$, $Qp_2$, and has a gate capacitance $Cg_1$ formed between the gate electrode 8 and the p-type well 3 and a gate capacitance $Cg_2$ between the gate electrode 9 and the n-type well 4.

Figure 30:
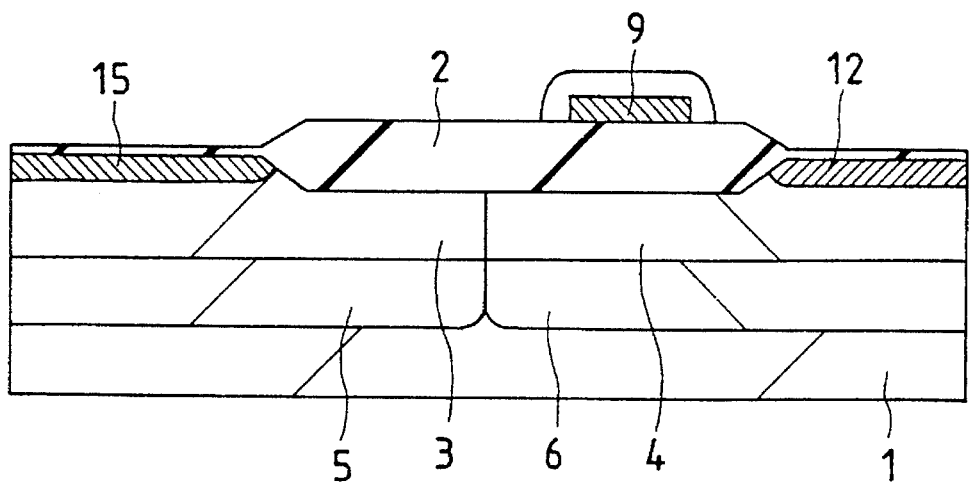
FIG. 30 is a cross section of the semiconductor chip (substrate) showing an isolation region of the driver MISFET and the load MISFET.
Figure 31:
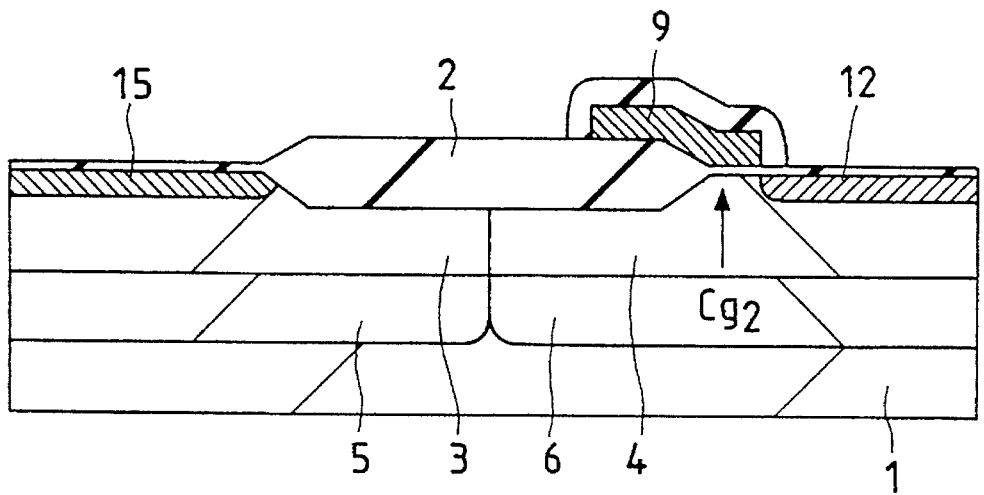
FIG. 31 is a cross section of the semiconductor chip (substrate) showing an isolation region of the driver MISFET and the load MISFET.

In the memory cells MC of the first to fourth embodiment, the n-channel driver MISFETs $Qd_1$, $Qd_2$ are formed on the main surface of the p-type well 3, and the p-channel load MISFETs $Qp_1$, $QP_2$ are formed on the main surface of the n-type well 4. Here, the n-type semiconductor region 15 of the driver MISFETs $Qd_1$, $Qd_2$ and the p-type semiconductor region 12 of the load MISFETs $Qp_1$, $Qp_2$ are, as shown in FIG. 30, are electrically isolated by a predetermined distance L' by means of an isolation region formed of the field insulation film 2 to prevent latch-up, In the fifth embodiment, however, because the position of the p-type semiconductor region 12 can be restricted by the gate electrode 9, as shown in FIG. 31, the distance L between the n-type semiconductor region 15 and the p-type semiconductor region 12 can be made equal to that of the first to fourth embodiments (L=L'). In other words, this embodiment permits the gate capacitance $Cg_2$ to be formed without increasing the area of the memory cell MC. This is also true for the gate capacitance $Cg_1$ formed between the gate electrode 8 and the p-type well 3.

Because of its capability of increasing the accumulated electric charge without deteriorating the latch-up resistance when the size of memory cell MC is reduced, the present invention can stably retain information and secure operation reliability.

Figure 32:
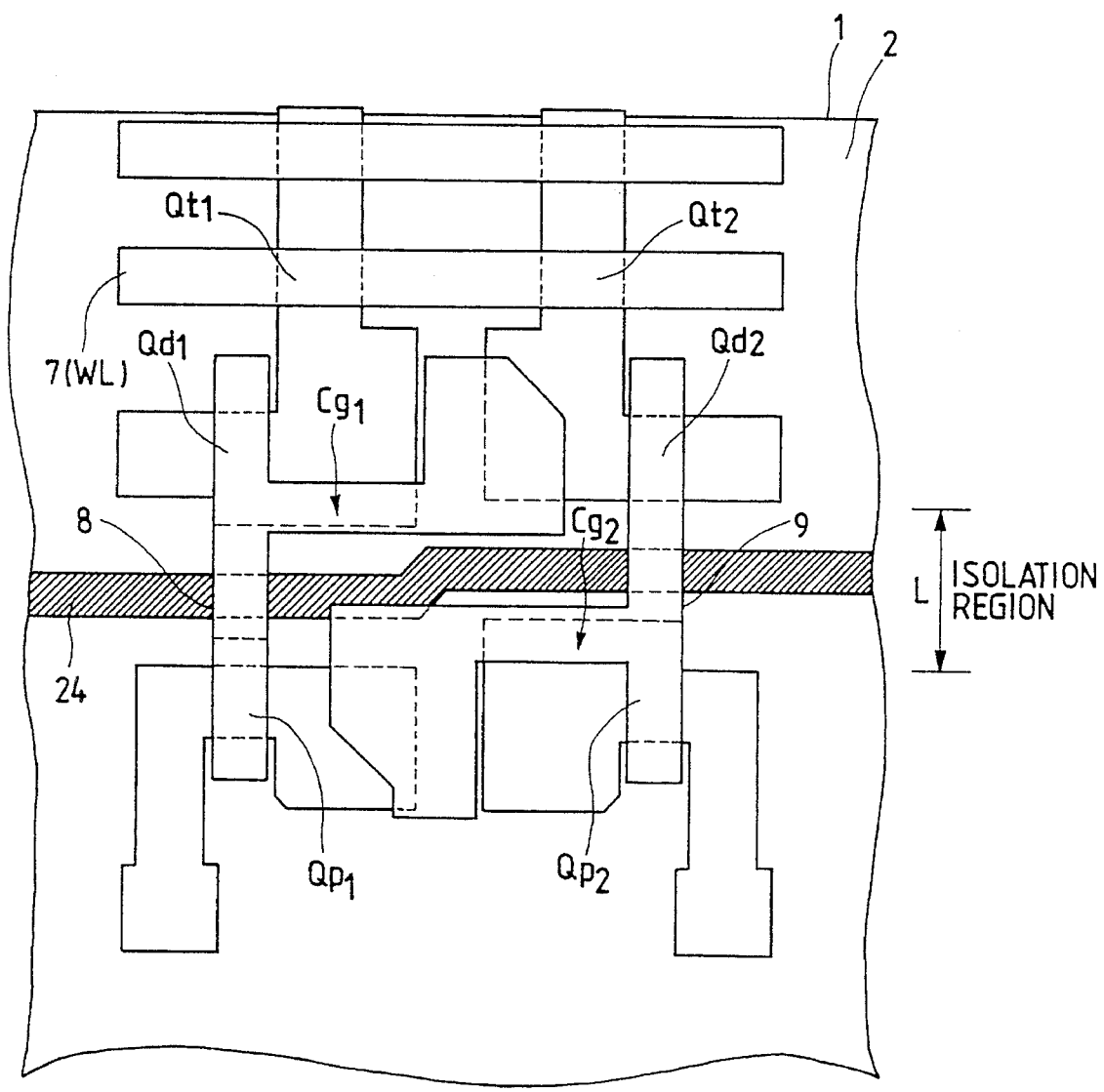
FIG. 32 is a plan view of the semiconductor chip (substrate) showing the SRAM memory cell of the second embodiment.

As shown in FIG. 32, because the provision of the U-groove 24 in the field insulation film 2 of the isolation region for the driver MISFETs $Qd_1$, $Qd_2$ and the load MISFETs $Qp_1$, $Qp_2$ prevents the occurrence of latch-up almost completely, it is possible to promote further reduction in the memory cell MC.

The invention has been described in conjunction with the preferred embodiments. It should be noted, however, that the invention is not limited to these embodiments alone and that various modifications may be made without departing from the spirit of this invention.

Figure 33:
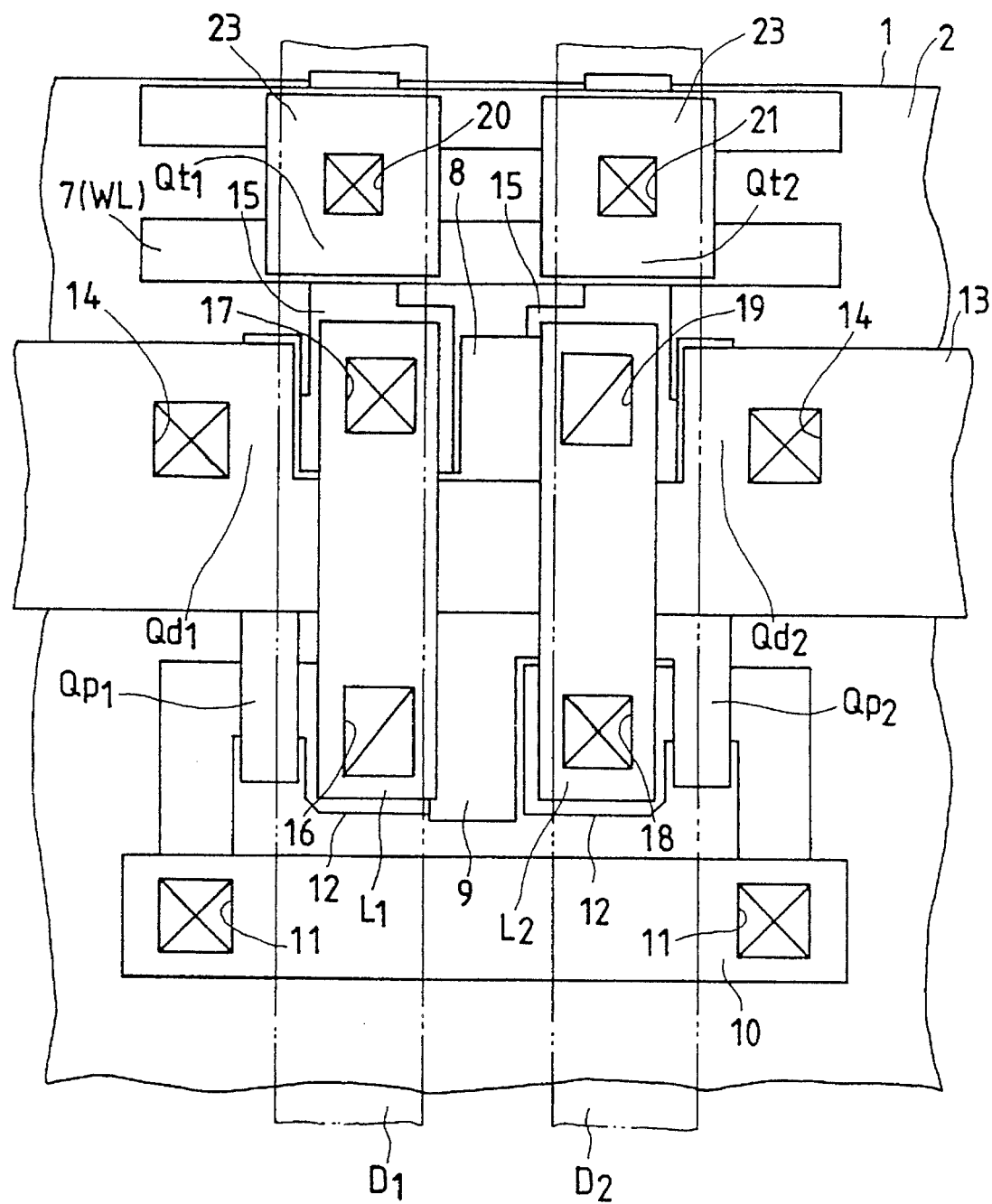
FIG. 33 is a plan view showing the layout of conductive layers forming the SRAM memory cell of the second embodiment.

When, for example, the capacitance Cs is to be formed between the reference voltage line 13 and the local interconnection lines $L_1$, $L_2$, the power source voltage line 10 may be reduced in size and located at the end of the memory cell MC as shown in FIG. 33.

Figure 34:
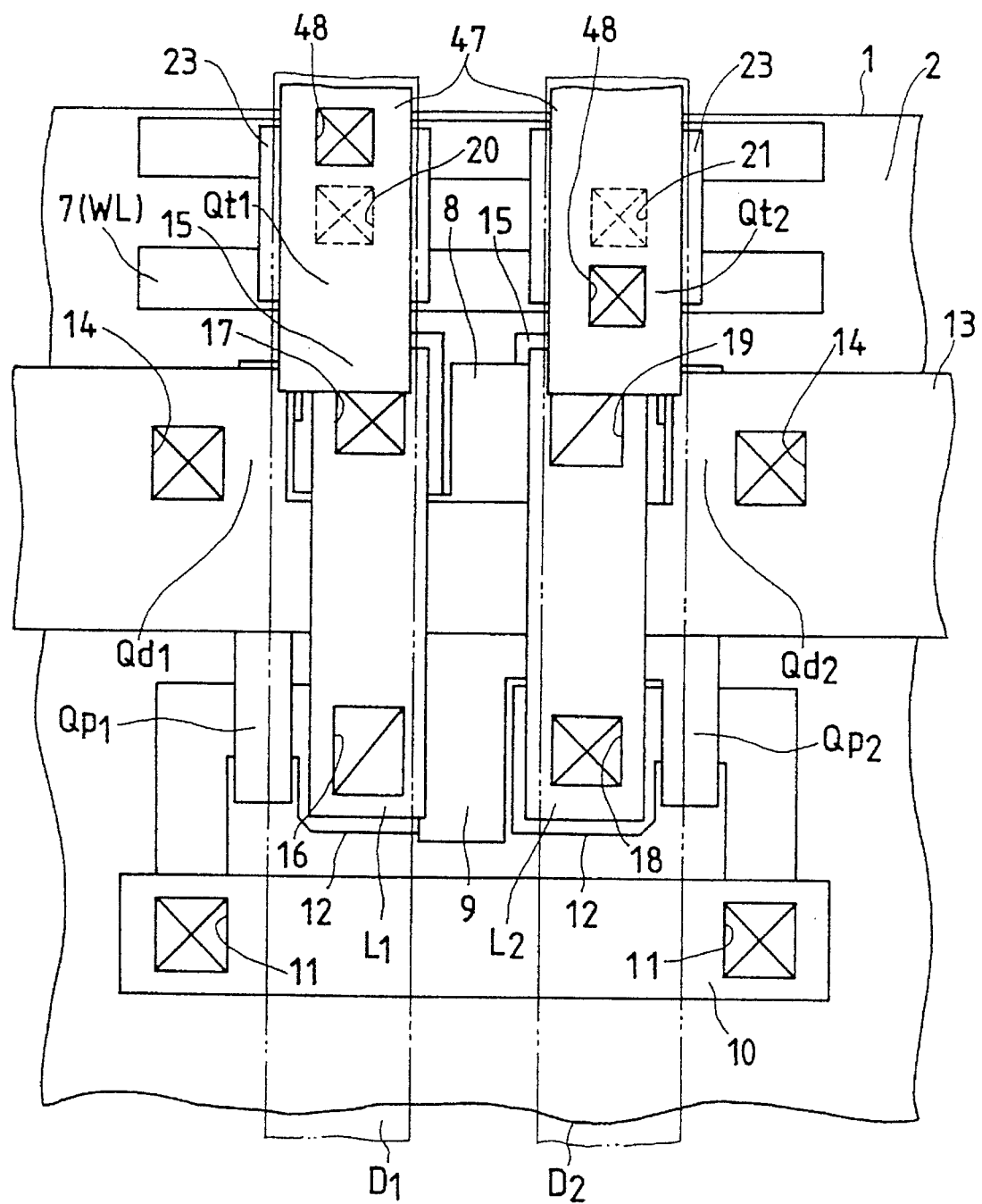
FIG. 34 is a plan view showing the layout of conductive layers forming the SRAM memory cell of the second embodiment.

Further, in cases where, as shown in FIG. 34, the reference voltage line 13 is formed of the second-layer poly-crystalline silicon film (or polycide film), the local interconnection lines $L_1$, $L_2$ are formed of a polycide film (a laminated film of polycrystalline silicon film and high melting point metal film), the power source voltage line 10 is formed of the first-layer metal film lying over the local interconnection lines $L_1$, $L_2$, and the capacitance Cs is formed between the reference voltage line 13 and the local interconnection lines $L_1$, $L_2$, it is possible to reduce the area of the power source voltage line 10 and locate it at the end of the memory cell MC. In FIG. 34, designates 47 is an intermediate conductive layers formed of the same first-layer metal film as is used for the power source voltage line 10. These intermediate conductive layers 47 are connected to the complementary data line (first data line $D_1$ and second data line $D_2$) through connection holes 48, respectively.

Figure 35:
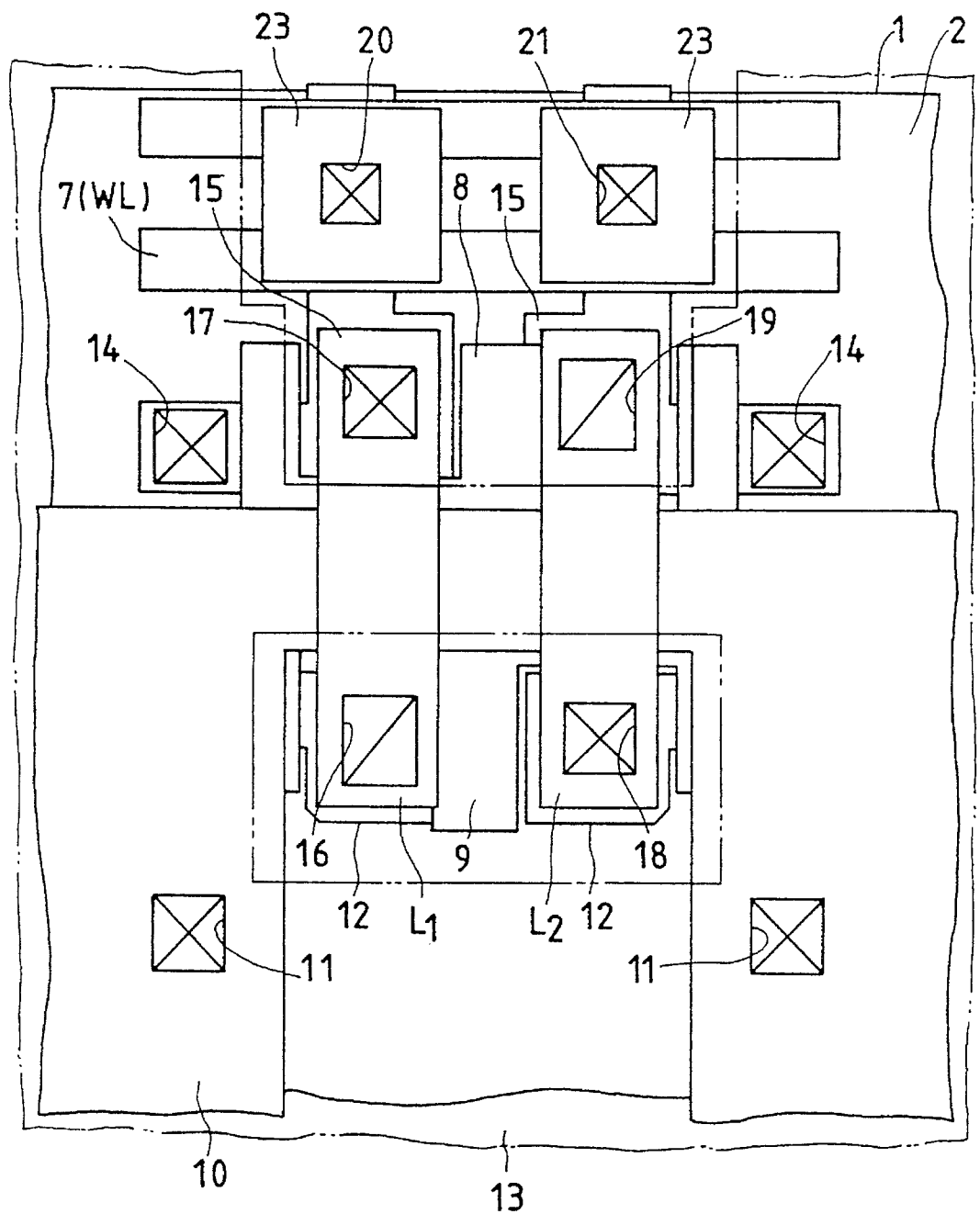
FIG. 35 is a plan view showing the layout of conductive layers forming the SRAM memory cell of the second embodiment.
Figure 36:
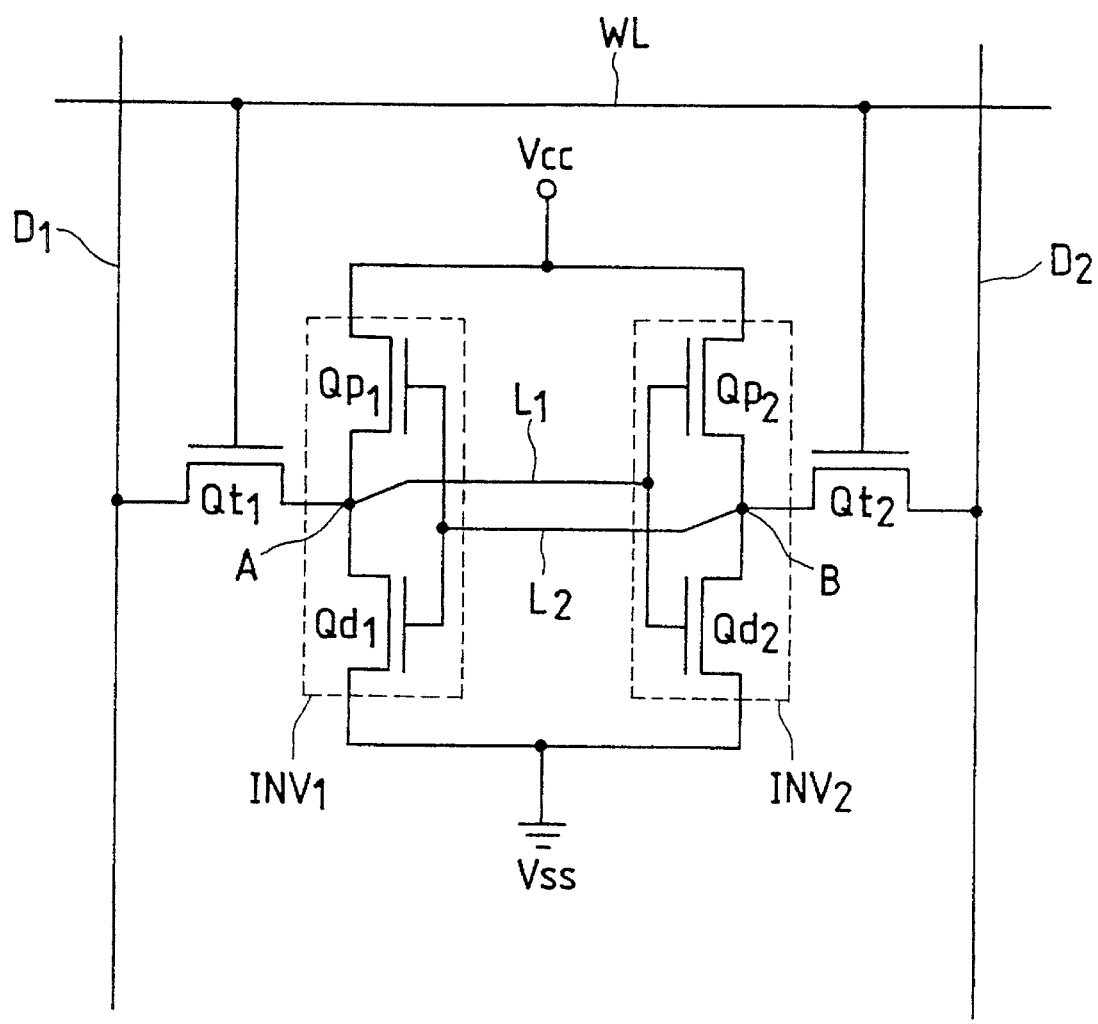
FIG. 36 is an equivalent circuit of the conventional SRAM memory cell.

As shown in FIG. 35, almost entire surface Of the memory cell MC (excluding the forming region of the connection holes 16–21) may be covered with the reference voltage line 13. This reduces the resistance value of the reference voltage line 13 and therefore increases the speed of the SRAM operation.

Representative advantages of this invention may be briefly summarized as follows.

(1) Because the power source voltage line, the reference voltage line and local interconnection lines are formed on different conductive layers, the dimensions of the memory cell are not restricted by the dimensions of these conductive layers, allowing significant reduction in the area of the SRAM memory cell.

(2) Because the area of the intersections between the local interconnection lines and the power source voltage line (or between the local interconnection lines and the reference voltage line) can be made large even when the memory cell area is reduced, the capacitance formed in the intersecting region and therefore the accumulated electric charge can be increased, allowing information to be retained stably even when the memory cell is reduced in size and thereby assuring operation reliability.

(3) The ability of this invention to form the gate capacitance without increasing the memory cell area permits the accumulated electric charge to be increased without degrading the latch-up resistance even when the memory cell size is minimized.

What is claimed is:

1. A semiconductor memory device comprising:

a semiconductor substrate having a main surface;

memory cells of a static random access memory, each comprising a first and a second driver MISFET, a first and a second load MISFET, and a first and a second transfer MISFET, wherein gate electrodes of said driver MISFETs, said load MISFETS, and said transfer MISFETs are formed over said main surface, respectively, and wherein source and drain regions of said driver MISFETs, said load MISFETs, and said transfer MISFETs are formed in said substrate, respectively;

a first insulating film formed over said gate electrodes so as to cover said driver MISFETs, said load MISFETs, and said transfer MISFETs;

first and second local interconnection lines being provided within each memory cell and formed over said first insulating film, respectively, wherein said first local interconnection line is provided, within each said memory cell, to effect an electrical connection at least between said drain region of said first driver MISFET and said drain region of said first load MISFET, and wherein said second local interconnection line is provided, within each said memory cell, to effect an electrical connection at least between said drain region of said second driver MISFET and said drain region of said second load MISFET;

a second insulating film formed over said first and second local interconnection lines so as to cover said main surface; and a first voltage supplying line, formed over said second insulating film, for supplying a first voltage to said memory cells, wherein said first voltage supplying line is electrically connected to one of said source regions of said driver MISFETs and said source regions of said load MISFETs and is extended over said first and second local interconnection lines to thereby cross, with respect to a plan view of said main surface of the substrate, said first and second local interconnection lines such that said first voltage supplying line, said second insulating film, and said first and second local interconnection lines form capacitor elements.

2. A semiconductor memory device according to claim 1, wherein said driver MISFETs are separated, in a first direction, from said load MISFETs within said memory cell, wherein said first and second local interconnection lines are extended in said first direction to effect an electrical connection, within said memory cell, between said drain regions of said first and said second driver MISFETs and between said drain regions of said first and said second load MISFETs, respectively, and wherein said first voltage supplying line is extended in a second direction, perpendicular to said first direction, so as to supply said first voltage to said memory cells arranged in said second direction.

3. A semiconductor memory device according to claim 2, wherein said first voltage is a power source voltage, and wherein said first voltage supplying line is electrically connected to said source regions of said load MISFETs.

4. A semiconductor memory device according to claim 3, wherein said driver MISFETs are n-channel MISFETs and said load MISFETs are p-channel MISFETs, respectively.

5. A semiconductor memory device according to claim 2, wherein said first voltage is a reference voltage, and wherein said first voltage supplying line is electrically connected to said source regions of said driver MISFETs.

6. A semiconductor memory device according to claim 2, further comprising:

a third insulating film formed over said gate electrodes so as to cover said driver MISFETs, said load MISFETs, and said transfer MISFETs; and a second voltage supplying line, formed over said third insulating film, for supplying a second voltage to said memory cells, wherein said first insulating film is formed over said third insulating film and said second voltage supplying line so as to cover said main surface, and wherein said second voltage supplying line is electrically connected to another of said source regions of said driver MISFETs and said source regions of said load MISFETs and is extended, below said first and second local interconnection lines, in said second direction, to thereby cross, with respect to a plan view of said main surface of the substrate, said first and second local interconnection lines such that said second voltage supplying line, said first insulating film, and said first and second local interconnection lines form capacitor elements.

7. A semiconductor memory device according to claim 6, wherein, with respect to said plan view of said main surface of the substrate, said second voltage supplying line is extended in said second direction between said driver MISFETs and said load MISFETs.

8. A semiconductor memory device according to claim 7, wherein said first voltage is one of a power source voltage and a reference voltage, and wherein said second voltage is the other of said power source voltage and said reference voltage.

9. A semiconductor memory device according to claim 7, wherein said gate electrode of said first driver MISFET is integrally formed with said gate electrode of said first load MISFET and is electrically connected to said drain region of said second driver MISFET, and wherein said gate electrode of said second driver MISFET is integrally formed with said gate electrode of said second load MISFET and is electrically connected to said drain region of said first load MISFET.

10. A semiconductor memory device according to claim 2, wherein said gate electrode of said first driver MISFET is integrally formed with said gate electrode of said first load MISFET and is electrically connected to said drain region of said second driver MISFET, and wherein said gate electrode of said second driver MISFET is integrally formed with said gate electrode of said second load MISFET and is electrically connected to said drain region of said first load MISFET.

11. A semiconductor memory device according to claim 2, wherein a field insulation film on a diagonal line of an isolation region for the driver MISFET and the load MISFET is set back and a gate capacitance is formed between the gate electrode of the load MISFET and the driver MISFET and the semiconductor substrate.

12. A semiconductor memory device comprising:

a semiconductor substrate having a main surface;

memory cells of a static random access memory, each comprising a first and a second driver MISFET, a first and a second load MISFET, and a first and a second transfer MISFET, wherein said driver MISFETs are separated, in a first direction, from said load MISFETs within each said memory cell, wherein gate electrodes of said driver MISFETs, said load MISFETS, and said transfer MISFETs are formed over said main surface, respectively, and wherein source and drain regions of said driver MISFETs, said load MISFETs, and said transfer MISFETs are formed in said substrate, respectively;

a first insulating film formed over said gate electrodes so as to cover said driver MISFETs, said load MISFETs, and said transfer MISFETs;

first and second local interconnection lines formed over said first insulating film and extending in said first direction such that said first local interconnection line, provided within said memory cell, effects an electrical connection at least between said drain region of said first driver MISFET and said drain region of said first load MISFET and such that said second local interconnection line, provided within each said memory cell, effects an electrical connection at least between said drain region of said second driver MISFET and said drain region of said second load MISFET; and a first voltage supplying line formed over said first insulating film and extending in a second direction, perpendicular to said first direction, so as to supply a first voltage to said memory cells arranged in said second direction, wherein said first supplying line is electrically connected to one of said source regions of said driver MISFETs and said source regions of said load MISFETs, and is comprised of a different level layer from that of said first and second local interconnection lines and is arranged to cross said first and second local interconnection lines, with respect to a plan view of said main surface of the substrate, such that said first voltage supplying line, said first and second local interconnection lines, and a dielectric film formed therebetween form capacitor elements.

13. A semiconductor memory device according to claim 2, wherein said first voltage supplying line is formed below said first and second local interconnection lines.

14. A semiconductor memory device according to claim 13, wherein said gate electrode of said first driver MISFET is integrally formed with said gate electrode of said first load MISFET and is electrically connected to said drain region of said second driver MISFET, and wherein said gate electrode of said second driver MISFET is integrally formed with said gate electrode of said second load MISFET and is electrically connected to said drain region of said first load MISFET.

15. A semiconductor memory device according to claim 13, wherein, with respect to said plan view of said main surface of the substrate, said first voltage supplying line is extended in said second direction between said driver MISFETs and said load MISFETs.

16. A semiconductor memory device according to claim 15, wherein said first voltage is a power source voltage, and wherein said first voltage supplying line is electrically connected to said source regions of said load MISFETs.

17. A semiconductor memory device according to claim 15, wherein said first voltage is a reference voltage, and wherein said first voltage supplying line is electrically connected to said source regions of said driver MISFETs.

18. A semiconductor memory device according to claim 13, further comprising:

a second insulating film formed over said first and second local interconnection lines so as to cover said main surface; and a second voltage supplying line, formed over said second insulating film, for supplying a second voltage to said memory cells, wherein said second voltage supplying line is electrically connected to another of said source regions of said driver MISFETs and said source regions of said load MISFETs and is extended in said second direction over said first and second local interconnection lines to thereby cross, with respect to a plan view of said main surface of the substrate, said first and second local interconnection lines such that said second voltage supplying line, said first insulating film, and said first and second local interconnection lines form capacitor elements.

19. A semiconductor memory device according to claim 18, wherein said first voltage is one of a power source voltage and a reference voltage, and wherein said second voltage is the other of said power source voltage and said reference voltage.

20. A semiconductor memory device according to claim 13, wherein said first voltage supplying line is formed over said first and second local interconnection lines.

21. A semiconductor memory device according to claim 3, wherein said driver MISFETs are n-channel MISFETs and said load MISFETs are p-channel MISFETs, respectively.

22. A semiconductor memory device according to claim 12, wherein a field insulation film on a diagonal line of an isolation region for the driver MISFET and the load MISFET is set back and a gate capacitance is formed between the gate electrode of the load MISFET and the driver MISFET and the semiconductor substrate.

* * * * *